(12) United States Patent
Eom et al.

(10) Patent No.: US 12,276,531 B2
(45) Date of Patent: Apr. 15, 2025

(54) METHOD AND DEVICE TO CALIBRATE MAGNETIC FIELD DATA

(71) Applicant: Samsung Electronics Co., Ltd., Gyeonggi-do (KR)

(72) Inventors: Kihun Eom, Gyeonggi-do (KR); Taekeun Kim, Gyeonggi-do (KR); Shinhun Moon, Gyeonggi-do (KR); Kihong Min, Gyeonggi-do (KR); Sejeong Oh, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 263 days.

(21) Appl. No.: 17/896,435

(22) Filed: Aug. 26, 2022

(65) Prior Publication Data

US 2022/0412775 A1 Dec. 29, 2022

Related U.S. Application Data

(63) Continuation of application No. PCT/KR2022/006719, filed on May 11, 2022.

(30) Foreign Application Priority Data

Jun. 8, 2021 (KR) .......................... 10-2021-0074278

(51) Int. Cl.
*G01D 5/14* (2006.01)
*G01B 7/30* (2006.01)
*G01D 18/00* (2006.01)

(52) U.S. Cl.
CPC .............. *G01D 5/145* (2013.01); *G01B 7/30* (2013.01); *G01D 18/001* (2021.05)

(58) Field of Classification Search
CPC ......... G01D 5/145; G01D 18/001; G01B 7/30
See application file for complete search history.

(56) References Cited

U.S. PATENT DOCUMENTS

| 10,082,893 | B2 * | 9/2018 | Yun ........................ G01D 5/145 |
| 10,146,188 | B2 * | 12/2018 | Katzer ................ G04B 47/065 |
| 10,564,738 | B2 * | 2/2020 | Lim ....................... G04G 21/00 |
| 10,655,985 | B2 * | 5/2020 | Kim ........................ G01D 5/142 |
| 11,194,295 | B2 * | 12/2021 | Katzer ................ G04B 47/065 |
| 2012/0223699 | A1 | 9/2012 | Holman, Jr. et al. |
| 2016/0252979 | A1 * | 9/2016 | Yun .......................... G01D 5/58 345/184 |

(Continued)

FOREIGN PATENT DOCUMENTS

| EP | 3336618 A1 * | 6/2018 | ............. G04C 3/004 |
| JP | 2009-103467 A | 5/2009 | |

(Continued)

OTHER PUBLICATIONS

International Search Report dated Jun. 8, 2022.
Extended European Search Report dated Sep. 10, 2024.

*Primary Examiner* — Octavia Hollington
(74) *Attorney, Agent, or Firm* — Cha & Reiter, LLC

(57) ABSTRACT

An electronic device includes a rotating body coupled to a bezel part to be rotatable and including a plurality of magnets, a pair of Hall sensors configured to sense a magnetic field caused by the plurality of magnets, a magnetic sensor disposed in an internal space, and a processor configured to calibrate, based on first magnetic field data, second magnetic field data based on a calculated offset value.

21 Claims, 14 Drawing Sheets

(56) References Cited

U.S. PATENT DOCUMENTS

| | | | |
|---|---|---|---|
| 2016/0327915 A1* | 11/2016 | Katzer | .................. G04C 3/002 |
| 2019/0072908 A1 | 3/2019 | Katzer et al. | |
| 2019/0113889 A1* | 4/2019 | Kumar | ................ G06F 3/04845 |
| 2019/0317175 A1 | 10/2019 | Polley et al. | |
| 2020/0257248 A1 | 8/2020 | Nozawa | |

FOREIGN PATENT DOCUMENTS

| | | | |
|---|---|---|---|
| KR | 10-2010-0054121 A | | 5/2010 |
| KR | 10-1013288 B1 | | 2/2011 |
| KR | 10-2015-0108236 A | | 9/2015 |
| KR | 20150108236 A | * | 9/2015 |
| KR | 10-2016-0104950 A | | 9/2016 |
| KR | 10-2019-0079420 A | | 7/2019 |
| KR | 10-2151864 B1 | | 9/2020 |
| KR | 10-2206457 B1 | | 1/2021 |

\* cited by examiner

METHOD AND DEVICE TO CALIBRATE MAGNETIC FIELD DATA

CROSS-REFERENCE TO RELATED APPLICATIONS

This application is a continuation of International Application No. PCT/KR2022/006719 designating the United States, filed on May 11, 2022, in the Korean Intellectual Property Receiving Office and claiming priority to Korean Patent Application No. 10-2021-0074278, filed on Jun. 8, 2021, in the Korean Intellectual Property Office, the disclosures of which are incorporated by reference herein in their entireties.

BACKGROUND

1. Field

One or more embodiments of the instant disclosure generally relate to method and apparatus for calibrating magnetic field data.

2. Description of Related Art

An electronic device such as a smart watch having a bezel may include a Hall sensor that measures magnetic force. The Hall sensor may be disposed below the bezel in order to detect the rotation of the bezel. The rotation angle may be recognized by measuring variation of the magnetic force generated by the movement of a magnet disposed on the bezel, where the movement corresponds to the bezel's rotation. The above-described Hall sensor, used to measure magnetic force, may sense magnetic field using the Hall effect. The "Hall effect" may refer to the effect where when magnetic field is applied to a conductor in which current is flowing, a force (e.g., Lorentz force) is generated in a predetermined direction, the flow of the current is changed by the force, and a voltage difference (hereinafter, referred to as "a Hall voltage") between two detection terminals caused by the change in the flow of the current is generated.

Since the magnet is disposed on the bezel to take advantage of the above-described Hall effect, and the magnetic force in the electronic device is changed every time the bezel rotates, and accordingly magnetic field disturbance may occur. Due to the magnetic field disturbance, a varying offset caused by the rotation variation of the bezel may be generated in the geomagnetism sensing value. If an azimuth is calculated based on geomagnetic data for which an offset is not compensated, the calculated azimuth may include an error.

SUMMARY

According to an example embodiment, an electronic device includes: a rotating body coupled to a bezel part to be rotatable about a rotation axis and including a plurality of magnets; a pair of Hall sensors disposed in the bezel part and configured to sense a magnetic field generated by the plurality of magnets; a magnetic sensor disposed in an internal space within a circumference of the rotating body; a processor electrically connected to the pair of Hall sensors and the magnetic sensor and configured to calibrate, based on first magnetic field data generated through sensing by the pair of Hall sensors, second magnetic field data generated through sensing by the magnetic sensor; and a memory electrically coupled to the processor.

According to an example embodiment, a method performed by an electronic device includes: generating first magnetic field data, through sensing by a pair of Hall sensors disposed in a bezel part of the electronic device, for a magnetic field caused by a plurality of magnets included in a rotating body coupled to the bezel part to be rotatable about a rotation axis; generating second magnetic field data through a magnetic sensor disposed in an internal space within a circumference of the rotating body; calculating a compensated offset value based on an angular position of the rotating body and the first magnetic field data; and calibrating the second magnetic field data based on the compensated offset value.

Additional aspects will be set forth in part in the description which follows and, in part, will be apparent from the description, or may be learned by practice of the presented embodiments.

BRIEF DESCRIPTION OF THE DRAWINGS

The above and other aspects, features, and advantages of certain embodiments of the present disclosure will be more apparent from the following detailed description, taken in conjunction with the accompanying drawings, in which.

DETAILED DESCRIPTION

Figure 1:
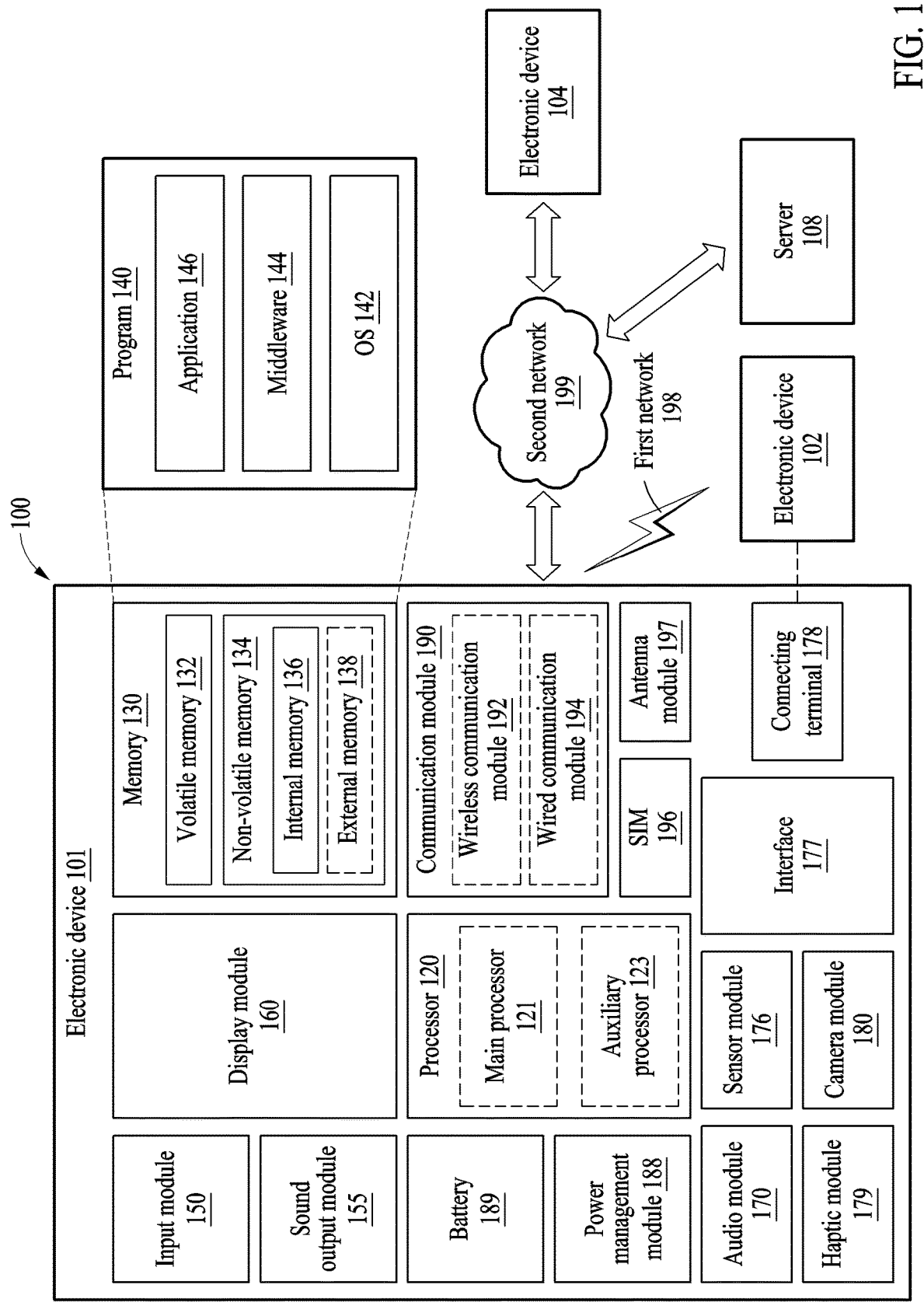
FIG. 1 is a block diagram illustrating an example electronic device in a network environment according to an example embodiment.

Hereinafter, various example embodiments will be described in greater detail with reference to the accompanying drawings. When describing the example embodiments with reference to the accompanying drawings, like reference numerals refer to like elements and a repeated description related thereto will be omitted.

Figure 2A:
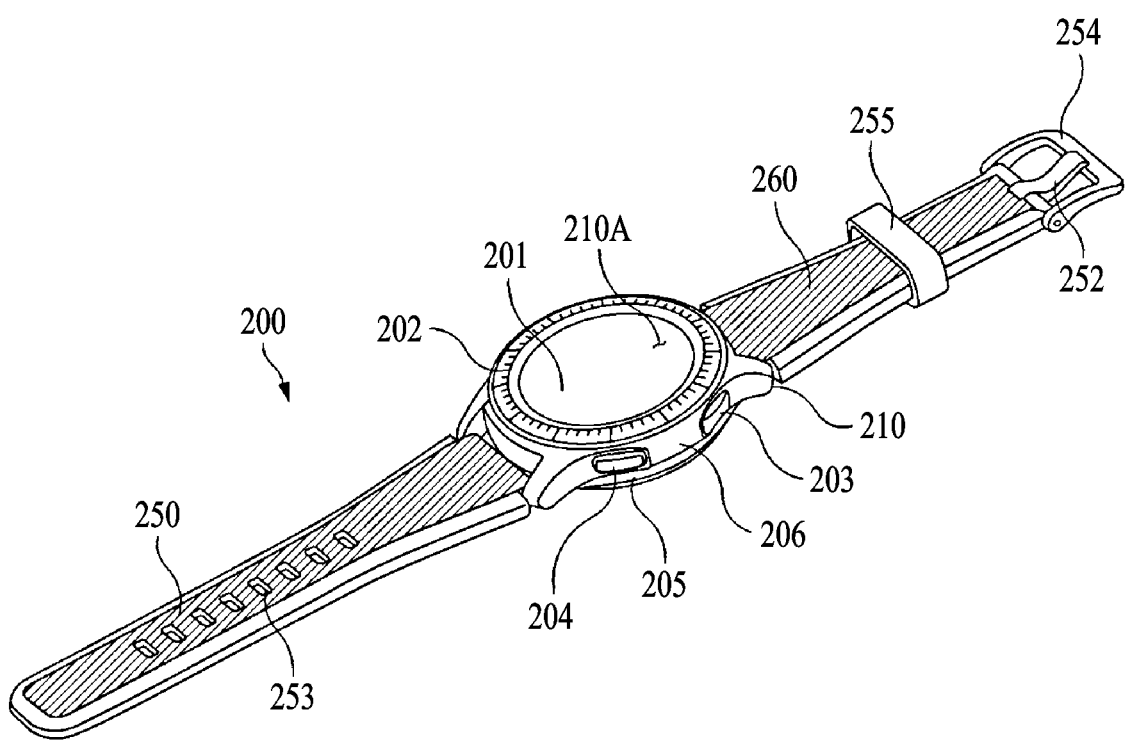
FIGS. 2A and 2B are perspective views illustrating an electronic device according to an example embodiment.
Figure 2B:
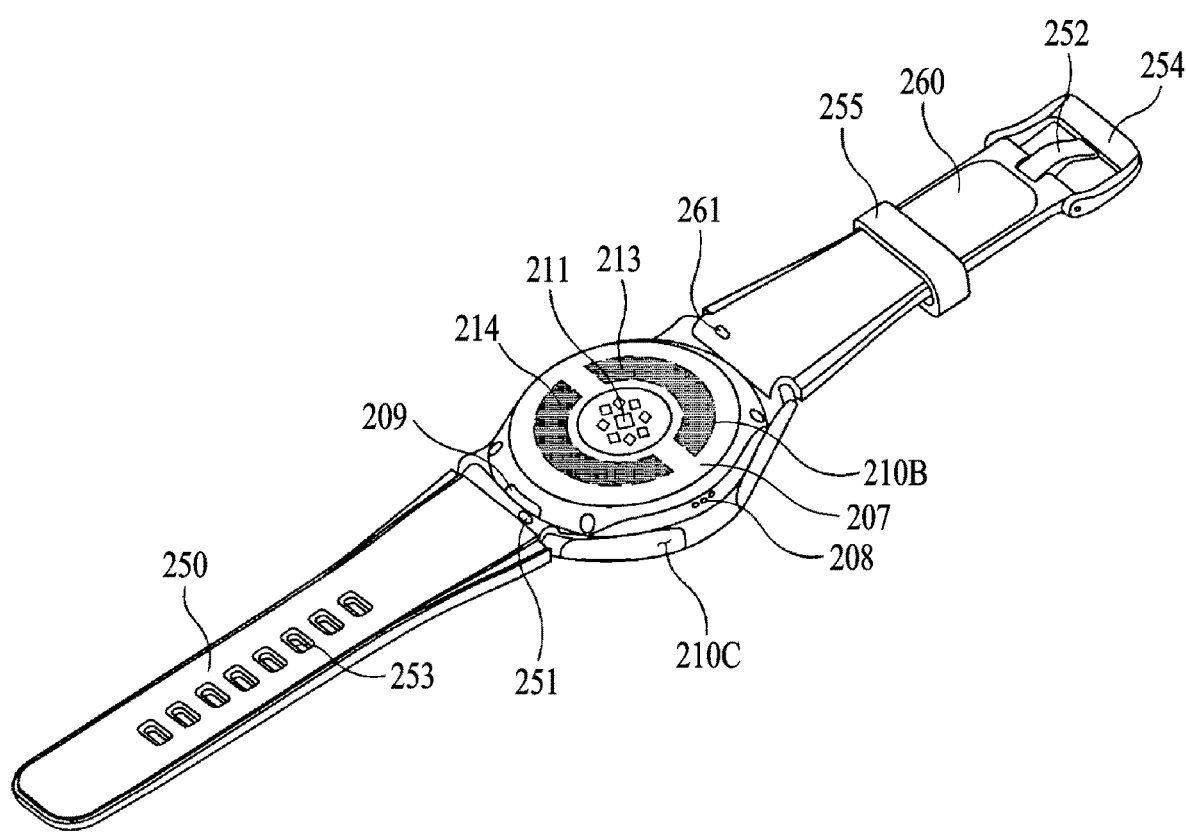
Figure 3:
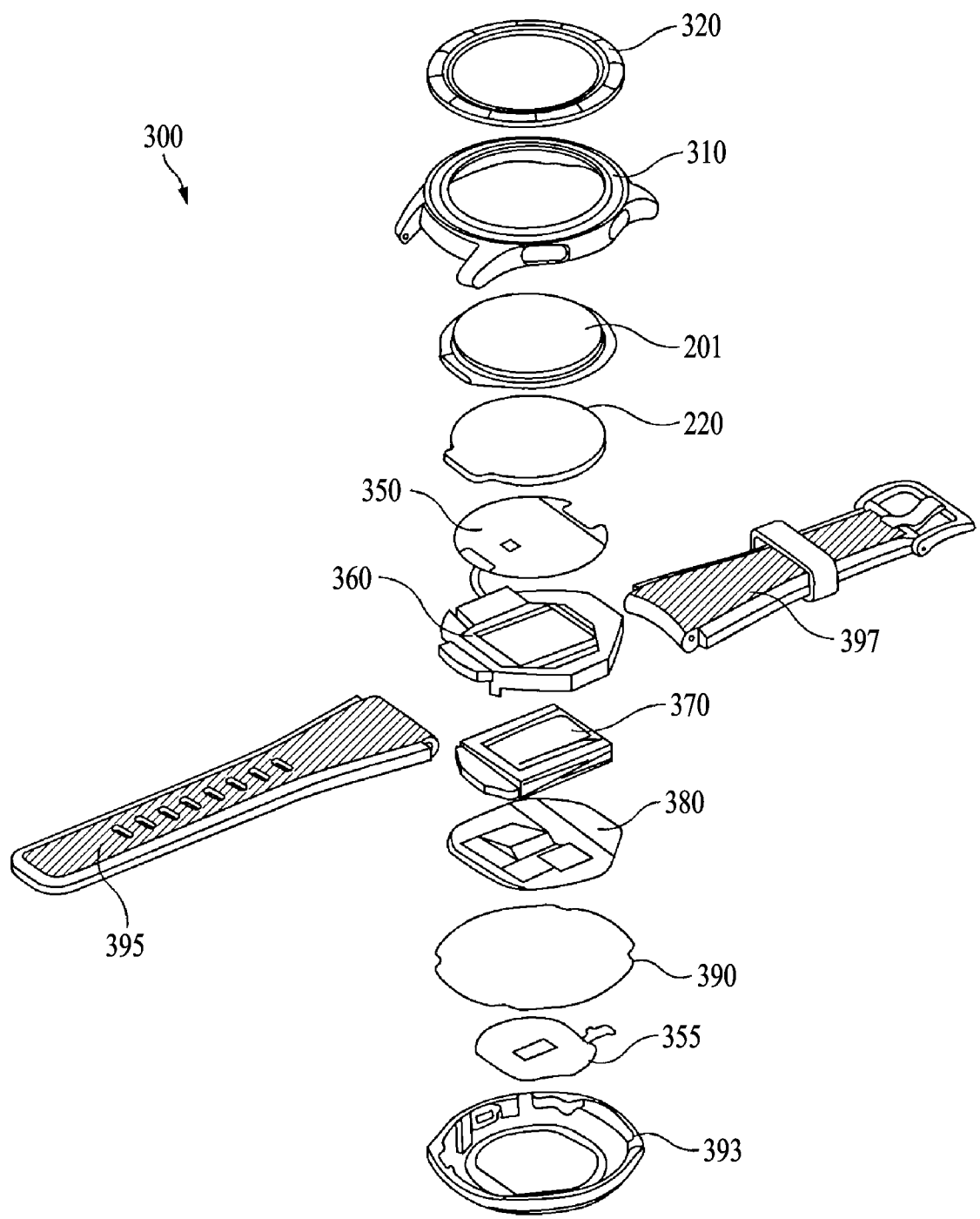
FIG. 3 is an exploded perspective view illustrating an electronic device according to an example embodiment.

FIG. 1 is a block diagram illustrating an electronic device 101 in a network environment 100 according to an example embodiment. FIGS. 2A and 2B are perspective views illustrating an electronic device according to an example embodiment, and FIG. 3 is an exploded perspective view illustrating an electronic device according to an example embodiment.

Referring to FIG. 1, the electronic device 101 in the network environment 100 may communicate with an electronic device 102 via a first network 198 (e.g., a short-range wireless communication network), or communicate with at least one of an electronic device 104 or a server 108 via a second network 199 (e.g., a long-range wireless communication network). According to an example embodiment, the electronic device 101 may communicate with the electronic device 104 via the server 108. According to an example embodiment, the electronic device 101 may include any one or any combination of a processor 120, a memory 130, an input device 150, a sound output device 155, a display device 160, an audio module 170, and a sensor module 176, an interface 177, a connecting terminal 178, a haptic module 179, a camera module 180, a power management module 188, a battery 189, a communication module 190, a subscriber identification module (SIM) 196, and an antenna module 197. In some example embodiments, at least one (e.g., the connecting terminal 178) of the above components may be omitted from the electronic device 101, or one or more other components may be added in the electronic device 101. In some example embodiments, some (e.g., the sensor module 176, the camera module 180, or the antenna module 197) of the components may be integrated as a single component (e.g., the display device 160).

The processor 120 may execute, for example, software (e.g., a program 140) to control at least one other component (e.g., a hardware or software component) of the electronic device 101 connected to the processor 120, and may perform various data processing or computation. According to an example embodiment, as at least a part of data processing or computation, the processor 120 may store a command or data received from another components (e.g., the sensor module 176 or the communication module 190) in a volatile memory 132, process the command or the data stored in the volatile memory 132, and store resulting data in a non-volatile memory 134. According to an example embodiment, the processor 120 may include a main processor 121 (e.g., a central processing unit (CPU) or an application processor (AP)) or an auxiliary processor 123 (e.g., a graphics processing unit (GPU), a neural processing unit (NPU), an image signal processor (ISP), a sensor hub processor, or a communication processor (CP)) that is operable independently of, or in conjunction with the main processor 121. For example, when the electronic device 101 includes the main processor 121 and the auxiliary processor 123, the auxiliary processor 123 may be adapted to consume less power than the main processor 121 or to be specific to a specified function. The auxiliary processor 123 may be implemented separately from the main processor 121 or as a part of the main processor 121.

The auxiliary processor 123 may control at least some of functions or states related to at least one (e.g., the display device 160, the sensor module 176, or the communication module 190) of the components of the electronic device 101, instead of the main processor 121 while the main processor 121 is in an inactive (e.g., sleep) state or along with the main processor 121 while the main processor 121 is an active state (e.g., executing an application). According to an example embodiment, the auxiliary processor 123 (e.g., an ISP or a CP) may be implemented as a portion of another component (e.g., the camera module 180 or the communication module 190) that is functionally related to the auxiliary processor 123. According to an example embodiment, the auxiliary processor 123 (e.g., an NPU) may include a hardware structure specified for artificial intelligence model processing. An artificial intelligence model may be generated by machine learning. Such learning may be performed by, for example, the electronic device 101 in which artificial intelligence is performed, or performed via a separate server (e.g., the server 108). Learning algorithms may include, but are not limited to, for example, supervised learning, unsupervised learning, semi-supervised learning, or reinforcement learning. The artificial intelligence model may include a plurality of artificial neural network layers. An artificial neural network may include, for example, a deep neural network (DNN), a convolutional neural network (CNN), a recurrent neural network (RNN), a restricted Boltzmann machine (RBM), a deep belief network (DBN), and a bidirectional recurrent deep neural network (BRDNN), a deep Q-network, or a combination of two or more thereof, but is not limited thereto. The artificial intelligence model may additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored as software in the memory 130, and may include, for example, an operating system (OS) 142, middleware 144, or an application 146.

The input device 150 may receive a command or data to be used by another component (e.g., the processor 120) of the electronic device 101, from the outside (e.g., a user) of the electronic device 101. The input device 150 may include, for example, a microphone, a mouse, a keyboard, a key (e.g., a button), or a digital pen (e.g., a stylus pen).

The sound output device 155 may output a sound signal to the outside of the electronic device 101. The sound output device 155 may include, for example, a speaker or a receiver. The speaker may be used for general purposes, such as playing multimedia or playing record. The receiver may be used to receive an incoming call. According to an example embodiment, the receiver may be implemented separately from the speaker or as a part of the speaker.

The display device 160 may visually provide information to the outside (e.g., a user) of the electronic device 101. The display device 160 may include, for example, a control circuit for controlling a display, a hologram device, or a projector and control circuitry to control a corresponding one of the display, the hologram device, and the projector. According to an example embodiment, the display device 160 may include a touch sensor adapted to sense a touch, or a pressure sensor adapted to measure an intensity of a force incurred by the touch.

The audio module 170 may convert a sound into an electric signal or vice versa. According to an example embodiment, the audio module 170 may obtain the sound via the input device 150 or output the sound via the sound output device 155 or an external electronic device (e.g., an electronic device 102 such as a speaker or a headphone) directly or wirelessly connected to the electronic device 101.

The sensor module 176 may detect an operational state (e.g., power or temperature) of the electronic device 101 or an environmental state (e.g., a state of a user) external to the electronic device 101, and generate an electric signal or data value corresponding to the detected state. According to an example embodiment, the sensor module 176 may include, for example, an optical sensor, a motion sensor, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor. In addition, the sensor module 176 may include a pair of Hall sensors and a magnetic sensor. The pair of Hall sensors may sense magnetic fore according to the change in position of a magnet that will be described with reference to FIGS. 4A through 4C, and the magnetic sensor may sense an external magnetic force (for example, geomagnetism).

The interface 177 may support one or more specified protocols to be used for the electronic device 101 to be coupled with the external electronic device (e.g., the electronic device 102) directly (e.g., wiredly) or wirelessly. According to an example embodiment, the interface 177 may include, for example, a high-definition multimedia interface (HDMI), a universal serial bus (USB) interface, a secure digital (SD) card interface, or an audio interface.

The connecting terminal 178 may include a connector via which the electronic device 101 may be physically connected to an external electronic device (e.g., the electronic device 102). According to an example embodiment, the connecting terminal 178 may include, for example, an HDMI connector, a USB connector, an SD card connector, or an audio connector (e.g., a headphone connector).

The haptic module 179 may convert an electric signal into a mechanical stimulus (e.g., a vibration or a movement) or an electrical stimulus which may be recognized by a user via his or her tactile sensation or kinesthetic sensation. According to an example embodiment, the haptic module 179 may include, for example, a motor, a piezoelectric element, or an electric stimulator.

The camera module 180 may capture a still image and moving images. According to an example embodiment, the camera module 180 may include one or more lenses, image sensors, image signal processors, or flashes.

The power management module 188 may manage power supplied to the electronic device 101. According to an example embodiment, the power management module 188 may be implemented as, for example, at least a part of a power management integrated circuit (PMIC).

The battery 189 may supply power to at least one component of the electronic device 101. According to an example embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently of the processor 120 (e.g., an AP) and that support a direct (e.g., wired) communication or a wireless communication. According to an example embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module, or a power line communication (PLC) module). A corresponding one of these communication modules may communicate with the external electronic device 104 via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a 5G network, a next-generation communication network, the Internet, or a computer network (e.g., a LAN or a wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the SIM 196.

The wireless communication module 192 may support a 5G network after a 4G network, and a next-generation communication technology, e.g., a new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., a mmWave band) to achieve, e.g., a high data transmission rate. The wireless communication module 192 may support various technologies for securing performance on a high-frequency band, such as, e.g., beamforming, massive multiple-input and multiple-output (MIMO), full dimensional MIMO (FD-MIMO), an array antenna, analog beam-forming, or a large scale antenna. The wireless communication module 192 may support various requirements specified in the electronic device 101, an external electronic device (e.g., the electronic device 104), or a network system (e.g., the second network 199). According to an example embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to an example embodiment, the antenna module 197 may include a slit antenna, and/or an antenna including a radiating element including a conductive material or a conductive pattern formed in or on a substrate (e.g., a printed circuit board (PCB)). According to an example embodiment, the antenna module 197 may include a plurality of antennas (e.g., array antennas). In such a case, at least one antenna appropriate for a communication scheme used in a communication network, such as the first network 198 or the second network 199, may be selected by, for example, the communication module 190 from the plurality of antennas. The signal or the power may be transmitted or received between the communication module 190 and the external electronic device via the at least one selected antenna. According to an example embodiment, another component (e.g., a radio frequency integrated circuit (RFIC)) other than the radiating element may be additionally formed as a part of the antenna module 197.

According to an example embodiment, the antenna module 197 may form a mmWave antenna module. According to an example embodiment, the mmWave antenna module may include a PCB, an RFIC disposed on a first surface (e.g., a bottom surface) of the PCB or adjacent to the first surface and capable of supporting a designated a high-frequency band (e.g., the mmWave band), and a plurality of antennas (e.g., array antennas) disposed on a second surface (e.g., a top or a side surface) of the PCB, or adjacent to the second surface and capable of transmitting or receiving signals in the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an example embodiment, commands or data may be transmitted or received between the electronic device 101 and the external electronic device 104 via the server 108 coupled with the second network 199. Each of the external electronic devices 102 and 104 may be a device of the same type as or a different type from the electronic device 101. According to an example embodiment, all or some of operations to be executed by the electronic device 101 may be executed at one or more of the electronic devices 102 and 104, and the server 108. For example, if the electronic device 101 needs to perform a function or a service automatically, or in response to a request from a user or another device, the electronic device 101, instead of, or in addition to, executing the function or the service, may request one or more external electronic devices to perform at least part of the function or the service. The one or more external electronic devices receiving the request may perform the at least part of the function or the service requested, or an additional function or an additional service related to the request, and may transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In an example embodiment, the external electronic device 104 may include an Internet-of-things (IoT) device. The server 108 may be an intelligent server using machine learning and/or a neural network. According to an example embodiment, the external electronic device 104 or the server 108 may be included in the second network 199. The electronic device 101 may be applied to intelligent services (e.g., smart home, smart city, smart car, or healthcare) based on 5G communication technology or IoT-related technology.

Referring to FIGS. 2A and 2B, an electronic device 200 (e.g., the electronic device 101 of FIG. 1) according to an example embodiment may include a housing 210 including a first surface (or a front surface) 210A, a second surface (or a rear surface) 210B, and a side surface 210C that surrounds the space between the first surface 210A and the second surface 210B, and fastening members 250 and 260 connected to at least portions of the housing 210 and configured to detachably fasten the electronic device 200 to a portion (e.g., wrist, ankle, etc.) of the body of a user. In another embodiment (not illustrated), the housing may refer to a structure that includes portions of the first surface 210A, the second surface 210B, and the side surface 210C of FIGS. 2A and 2B. According to an example embodiment, the first surface 210A may be defined by a front plate 201 (e.g., glass plate or polymer plate including various coating layers), at least a portion of which is substantially transparent. The second surface 210B may be defined by a rear plate 207 that is substantially opaque. The rear plate 207 may be made of, for example, coated or colored glass, ceramics, polymer, metal (e.g., aluminum, stainless steel (STS), or magnesium), or a combination of at least two thereof. The side surface 210C may be coupled to the front plate 201 and the rear plate 207, and may be defined by a side bezel structure 206 (or "side member" or "bezel part") that includes metal and/or polymer. In some example embodiments, the rear plate 207 and the side bezel structure 206 may be integrated and may include the same material (e.g., a metallic material such as aluminum). The fastening members 250 and 260 may be made of various materials and may have various shapes. For example, the fastening members 250 and 260 may be implemented by a single body or a plurality of unit links that may move with respect to each other, and may be made of woven fabric, leather, rubber, urethane, metal, ceramics, or a combination of at least two thereof.

According to an example embodiment, the electronic device 200 may include at least one of a display 220 (with reference to FIG. 3), audio modules 205 and 208, a sensor module 211, key input devices 202, 203, and 204, and a connector hole 209. In some example embodiments, at least one (e.g., the key input devices 202, 203, and 204, the connector hole 209, or the sensor module 211) of the components may be omitted from the electronic device 200 or another component may be additionally included in the electronic device 200.

The display 220 may be visually exposed through, for example, the corresponding portion of the front plate 201. The shape of the display 220 may correspond to the shape of the front plate 201, and may be various shapes, such as circular shape, elliptical shape, or polygonal shape. The display 220 may be coupled to or be disposed to be adjacent to a touch detection circuit, a pressure sensor that may measure the strength (the pressure) of touches from the user, and/or a fingerprint sensor.

The audio modules 205 and 208 may include a microphone hole 205 and a speaker hole 208. A microphone for acquiring external sound may be disposed in the microphone hole 205, and in some example embodiments, a plurality of microphones may be disposed so that they can detect the directionality of sound. The speaker hole 208 may be used for a speaker and a communication receiver. In some example embodiments, the speaker hole 208 and the microphone hole 205 may be implemented as one hole, or the speaker may be included in the electronic device 200 without the speaker hole 208 (e.g., a piezoelectric speaker).

The sensor module 211 may generate electric signal or data values corresponding to internal operational states of the electronic device 200 or external environmental states of the electronic device 200. The sensor module 211 may include, for example, a biometric sensor module 211 (e.g., heart rate monitor (FIRM) sensor) disposed on the second surface 210B of the housing 210. The electronic device 200 may further include a sensor module (not illustrated), for example, at least one of an optical sensor, a motion sensor (e.g., gyro sensor, acceleration sensor, or velocity sensor), a gesture sensor, an atmospheric pressure sensor, a magnetic sensor, a grip sensor, a color sensor, an IR sensor, a biometric sensor, a temperature sensor, a humidity sensor and an illuminance sensor.

The sensor module 211 may include electrode areas 213 and 214 that are included in a portion of the surface of the electronic device 200, and a bio-signal detection circuit (not illustrated) electrically connected to the electrode areas 213 and 214. For example, the electrode areas 213 and 214 may include a first electrode area 213 and a second electrode area 214 that are disposed on the second surface 210B of the housing 210. The sensor module 211 may acquire the electric signal from a portion of the body of the user and may be part of a bio-signal detection circuit to detect biometric information of the user.

The key input devices 202, 203 and 204 may include a wheel key 202 disposed on the first surface 210A of the housing 210, the wheel key 202 being rotatable in at least one direction, and/or side key buttons 203 and 204 disposed on the side surface 210C of the housing 210. The shape of the wheel key 202 may correspond to the shape of the front plate 201. In another embodiment, the electronic device 200 may not include some or all of the above-mentioned key input devices 202, 203 and 204, and the key input devices 202, 203 and 204 that are not included in the electronic device 200 may be implemented in different forms, such as soft keys, on the display 220. The connector hole 209 may accommodate a connector (e.g., USB connector) for transmitting or receiving power and/or data to or from the external electronic device, and include another connector hole (not illustrated) that is capable of accommodating a connector for transmitting or receiving audio signals to or from the external electronic device. The electronic device 200 may further include, for example, a connector cover (not illustrated) configured to cover at least a portion of the connector hole 209 to prevent introduction of external foreign substances through the connector hole.

The fastening members 250 and 260 may be detachably fastened to at least a partial area of the housing 210 using locking members 251 and 261. The fastening members 250 and 260 may include one or more of a fixing member 252, a fixing member coupling hole 253, a band guide member 254, and a band fixing ring 255.

The fixing member 252 may be configured to fix the housing 210 and the fastening members 250 and 260 to a portion (e.g., a wrist or a wrinkle) of the body of the user. The fixing member coupling hole 253 may fix the housing 210 and the fastening members 250 and 260 to a portion of the body of the user corresponding to the fixing member 252. The band guide member 254 may be configured to restrict a motion range of the fixing member 252 when the fixing member 252 is coupled to the fixing member coupling hole 253 so that the fastening members 250 and 260 are fastened to be attached to a portion of the body of the user. The band fixing ring 255 may restrict motion ranges of the fastening members 250 and 260 in a state in which the fixing member 252 and the fixing member coupling hole 253 are coupled to each other.

Referring to FIG. 3, an electronic device 300 (e.g., the electronic device 101 of FIG. 1 or the electronic device 200 of FIG. 2) may include a side bezel structure (or a "bezel part") 310, a wheel key (or a "rotating body") 320, a front plate 201, a display 220, a first antenna 350, a second antenna 355, a support member (e.g., a bracket) 360, a battery 370, a PCB 380, a sealing member 390, a rear plate 393, and fastening members 395 and 397. At least one of the components of the electronic device 300 may be the same as or similar to at least one of the components of the electronic device 101 of FIG. 1 or at least one of the components of the electronic device 200 of FIG. 2, and repeated description related thereto will be omitted. The support member 360 may be disposed in the electronic device 300 to be connected to the side bezel structure 310, or may be integrated with the side bezel structure 310. The support member 360 may be made of, for example, a metallic material and/or a non-metallic (e.g., a polymer) material. The display 220 may be coupled to one side of the support member 360, and the PCB 380 may be connected to the other side of the support member 360. The PCB 380 may be equipped with a processor, a memory, and/or an interface. The processor may include a microprocessor or any suitable type of processing circuitry, such as one or more general-purpose processors (e.g., ARM-based processors), a Digital Signal Processor (DSP), a Programmable Logic Device (PLD), an Application-Specific Integrated Circuit (ASIC), a Field-Programmable Gate Array (FPGA), a Graphical Processing Unit (GPU), a video card controller, etc. In addition, it would be recognized that when a general purpose computer accesses code for implementing the processing shown herein, the execution of the code transforms the general purpose computer into a special purpose computer for executing the processing shown herein. Certain of the functions and steps provided in the Figures may be implemented in hardware, software or a combination of both and may be performed in whole or in part within the programmed instructions of a computer. No claim element herein is to be construed as means-plus-function, unless the element is expressly recited using the phrase "means for." In addition, an artisan understands and appreciates that a "processor" or "microprocessor" may be hardware in the claimed disclosure.

The memory may include, for example, a volatile memory or a non-volatile memory. The interface may include, for example, an HDMI, a USB interface, an SD card interface, or an audio interface. The interface may electrically or physically connect, for example, the electronic device 300 to the external electronic device, and may include a USB connector, an SD card/MMC connector, or an audio connector.

The battery 370 may be a device for supplying power to at least one component of the electronic device 300, and may include, for example, a primary cell which is not rechargeable, a secondary cell which is rechargeable, or a fuel cell. At least a portion of the battery 370 may be positioned on, for example, substantially the same plane as the PCB 380. The battery 370 may be integrated within the electronic deice 200, or may be disposed to be user-removable from the electronic device 200.

The first antenna 350 may be disposed between the display 220 and the support member 360. The first antenna 350 may include, for example, a near field communication (NFC) antenna, a wireless charging antenna, and/or a magnetic secure transmission (MST) antenna. For example, the first antenna 350 may perform a short-range communication with an external device, wirelessly transmit or receive power required for charging, and transmit magnetism-based signals including short-range communication signal or payment data. According to an example embodiment, the antenna structure of the first antenna 350 may be implemented by a part of the side bezel structure 310 and/or the support member 360, or a combination thereof.

The second antenna 355 may be disposed between the PCB 380 and the rear plate 393. The second antenna 355 may include, for example, an NFC antenna, a wireless charging antenna, and/or an MST antenna. For example, the second antenna 355 may perform short-range communication with an external device, wirelessly transmit or receive power required for charging, and transmit magnetism-based signals including short-range communication signal or payment data. According to an example embodiment, the antenna structure of the second antenna 355 may be implemented by a part of the side bezel structure 310 and/or the rear plate 393, or a combination thereof.

The sealing member 390 may be positioned between the side bezel structure 310 and the rear plate 393. The sealing member 390 may be configured to prevent introduction of moisture and foreign substances into the internal space of the electronic device 300 surrounded by the side bezel structure 310 and the rear plate 393.

The electronic device according to certain embodiments may be one of various types of electronic devices. The electronic device may include, for example, a portable communication device (e.g., a smartphone), a computer device, a portable multimedia device, a portable medical device, a camera, a wearable device, or a home appliance. The electronic device according to an example embodiment of the disclosure is not limited to the above-described devices.

It should be appreciated that certain example embodiments of the disclosure and the terms used therein are not intended to limit the technological features set forth herein to particular example embodiments and include various changes, equivalents, or replacements for a corresponding example embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an example embodiment of the disclosure, the module may be implemented in a form of an application-specific integrated circuit (ASIC).

Certain example embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a compiler or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an example embodiment of the disclosure, a method according to certain example embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to certain example embodiments of the disclosure, each component (e.g., a module or a program) of the above-described components may include a single entity or multiple entities. According to certain example embodiments of the disclosure, one or more of the above-described components may be omitted, or one or more other components may be added. Alternatively or additionally, a plurality of components (e.g., modules or programs) may be integrated into a single component. In such a case, according to certain example embodiments of the disclosure, the integrated component may perform one or more functions of each of the plurality of components in the same or similar manner as they are performed by a corresponding one of the plurality of components before the integration. According to certain example embodiments of the disclosure, operations performed by the module, the program, or another component may be carried out sequentially, in parallel, repeatedly, or heuristically, or one or more of the operations may be executed in a different order or omitted, or one or more other operations may be added.

Figure 4A:
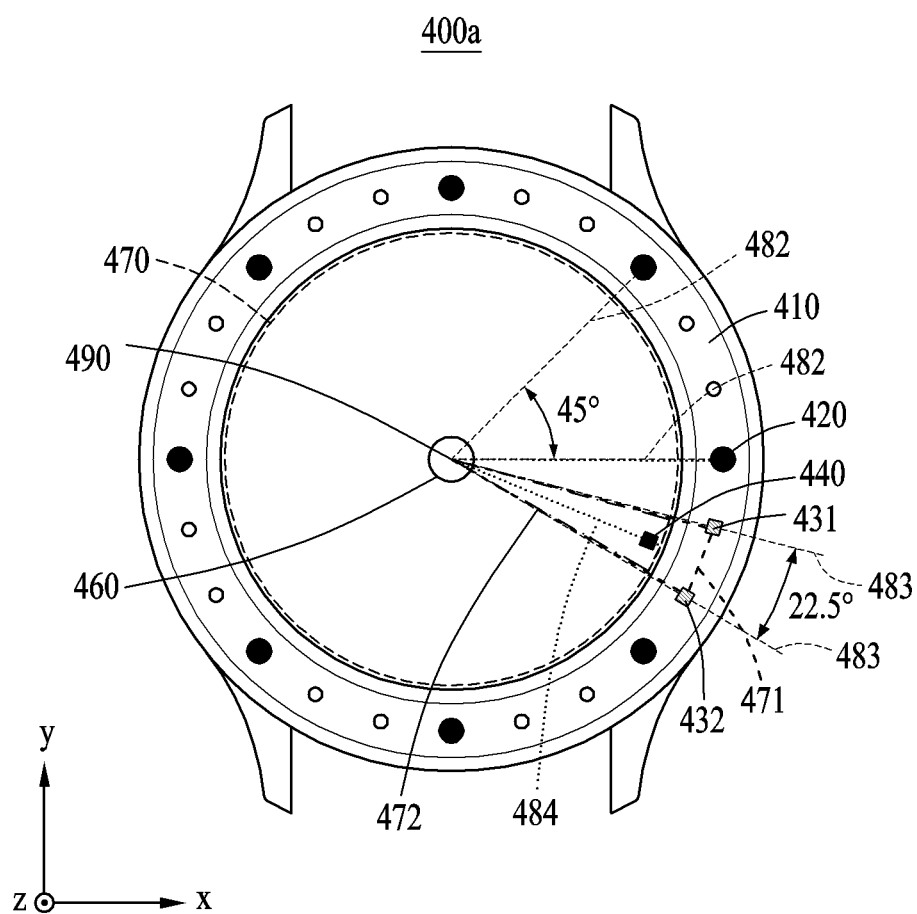
FIGS. 4A through 4C illustrate an arrangement of a pair of Hall sensors and a magnetic sensor in an electronic device according to an example embodiment.
Figure 4B:
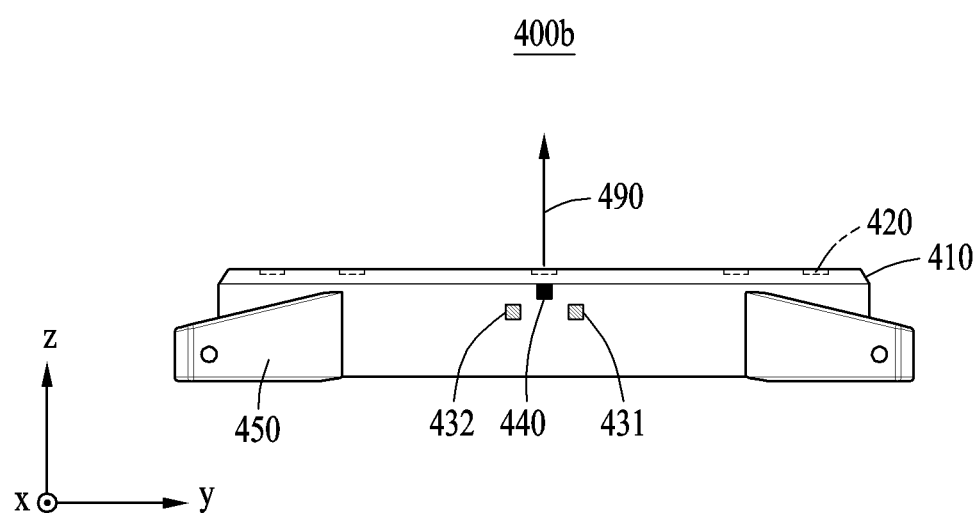
Figure 4C:
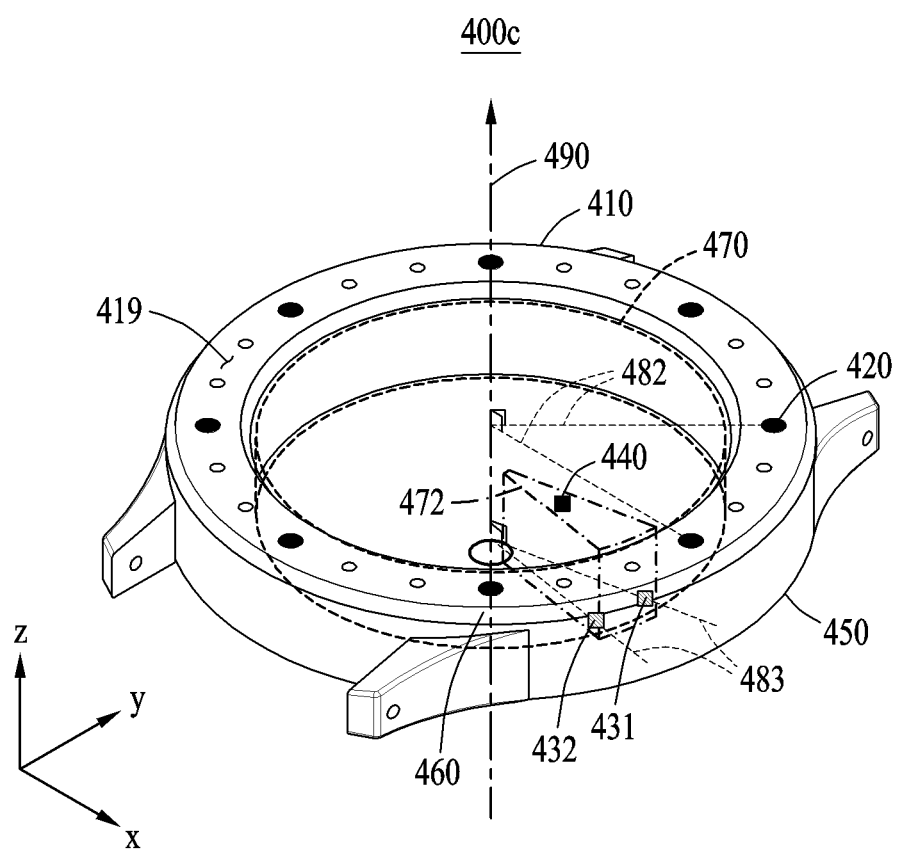

FIGS. 4A through 4C illustrate an arrangement of a pair of Hall sensors and a magnetic sensor in an electronic device according to an example embodiment.

FIG. 4A illustrates a top view 400a of an electronic device (e.g., the electronic device 101 of FIG. 1, the electronic device 200 of FIG. 2, or the electronic device 300 of FIG. 3), FIG. 4B illustrates a side view 400b of the electronic device, and FIG. 4C illustrates a perspective view 400c of the electronic device. In FIGS. 4A through 4C, a bezel part 450, a rotating body 410, a pair of Hall sensors 431 and 432, and a magnetic sensor 440 in the components of the electronic device will be primarily described. At least one of the components of the electronic device may be the same as or similar to at least one of the components of the electronic device 101 of FIG. 1, the electronic device 200 of FIG. 2 or the electronic device 300 of FIG. 3, and repeated description related thereto will be omitted.

The rotating body 410 (e.g., the wheel key 320 of FIG. 3) may be coupled to the bezel part 450 of the electronic device to be rotatable about a rotation axis 490. The rotating body 410 may be rotatable about the rotation axis 490 in the clockwise direction or the counter-clockwise direction. In FIGS. 4A through 4C, the rotation axis 490 is represented as the z-axis. The rotating body 410 may have a ring shape having a circumference about the rotation axis 490. A display (e.g., the display 220 of FIG. 3) may be disposed and exposed through an area within the circumference of the rotating body 410, which again has a ring shape.

The rotating body 410 may include a plurality of magnets 420. The plurality of magnets 420 may be disposed along the ring shape of the rotating body 410. For example, the plurality of magnets 420 may be disposed spaced apart by the same distance along the circumference of the ring shape of the rotating body 410. The plurality of magnets 420 may be disposed along the circumference in which the rotation axis 490 coincides with the center of the circumference. In the present disclosure, eight magnets 420 are described as an example. However, the number of magnets 420 may not be limited to eight. The number of magnets 420 may be "n", and "n" may be any integer equal to or greater than "2".

In FIGS. 4A through 4C, eight magnets 420 may be provided. The angle formed between adjacent magnets 420 about the rotation axis 490 may be 45 degrees. That is, the angle between straight lines 482 from two adjacent magnets 420 in the plurality of magnets 420 toward the rotation axis 490 may be 45 degrees. If the rotating body 410 includes "n" magnets 420, the angle formed between the adjacent magnets 420 about the rotation axis 490 may be "360/n" degrees.

The angle formed between two components about the rotation axis 490 may be an angle formed between one plane including the rotation axis 490 and one component and the other plane including the rotation axis 490 and another component. That is, the angle formed between a first component and a second component about the rotation axis 490 may be the angle between a first virtual straight line (e.g., a vertical line perpendicular to the rotation axis 490) from the rotation axis 490 toward the first component and a second virtual straight line (e.g., a vertical line perpendicular to the rotation axis 490) from the rotation axis 490 toward the second component. For example, when viewed in a direction perpendicular to the plane corresponding to the rotating body 410, the angle formed between the two components about the rotation axis 490 may be the angle between straight lines from the rotation axis 490 on a corresponding plane toward the components.

The plurality of magnets 420 may be accommodated in the rotating body 410, however, the instant disclosure is not so limited. For example, the plurality of magnets 420 may be attached and/or mounted on one side (e.g., the side facing the bezel part 450 or the opposite side) of the rotating body 410.

The pair of Hall sensors 431 and 432 may sense magnetic field generated by the plurality of magnets 420. For example, the pair of Hall sensors 431 and 432 may generate signal (e.g., voltage signal) corresponding to the magnetic field that varies according to a Hall effect. The signal may be referred to as magnetic field data. The pair of Hall sensors 431 and 432 may sense magnetic field intensity variation caused by movement of the plurality of magnets 420 when the rotating body 410 is rotated. In the present disclosure, magnetic field data indicative of the magnetic field sensed by each of the pair of Hall sensors 431 and 432 may be referred to as first magnetic field data. For example, the pair of Hall sensors 431 and 432 may be disposed in the bezel part 450, and sense the magnetic field caused by the magnetic force of the plurality of magnets 420. A processor of the electronic device may generate first magnetic field data that indicates the magnetic field intensity value sensed by each of the pair of Hall sensors 431 and 432, after magnetic field is sensed by each of the pair of Hall sensors 431 and 432. The first magnetic field data may take into account or include a magnetic field component (e.g., internal magnetic field component) that is data generated by magnets (e.g., the plurality of magnets 420) disposed in the electronic device. The first magnetic field data may further include a magnetic field component (e.g., external magnetic field component) that is data caused by an external factor (e.g., the geomagnetism) in addition to the magnetic field component by the magnets disposed in the electronic device. The first magnetic field data may include a value obtained by mixing the above-described internal magnetic field component and the external magnetic field component, and in the first magnetic field data, the magnetic field component by the magnets disposed in the electronic device may have a magnitude greater than the magnitude of the magnetic field component by the external factor.

According to an example embodiment, the angle formed between the Hall sensors 431 and 432 about the rotation axis 490 may be less than an angle formed between two adjacent magnets 420 in the plurality of magnets 420 about the rotation axis 490. For example, the pair of Hall sensors 431 and 432 may be disposed such that the angle between two virtual straight lines 483 from the rotation axis 490 toward the Hall sensors 431 and 432 may be less than the angle between two virtual straight lines 482 from the rotation axis 490 toward the two adjacent magnets 420 among the plurality of magnets 420. When viewed in a direction (e.g., the rotation axis 490) perpendicular to the plane corresponding to the rotating body 410, the angle (e.g., 22.5 degrees) between the virtual straight lines 483 from points corresponding to the pair of Hall sensors 431 and 432 on the plane toward the rotation axis 490 may be half of the angle (e.g., 45 degrees) between the virtual straight lines 482 from the two adjacent magnets 420 toward the rotation axis 490. As described above, if eight magnets 420 are provided, the angle between virtual straight lines 483 from the pair of Hall sensors 431 and 432 toward the rotation axis 490 may be 22.5 degrees, because the angle between the adjacent magnets 420 about the rotation axis 490 is 45 degrees. If the rotating body 410 includes "n" magnets 420, the angle formed between the pair of Hall sensors 431 and 432 about the rotation axis 490 may be "360/2n" degrees. Thus, one or no magnet may be positioned in the space between the pair of Hall sensors 431 and 432, as the positions of the plurality of magnets 420 are changed due to the rotation of the rotating body 410. The processor (e.g., the processor 120 of FIG. 1) may estimate a rotation variation of the rotating body 410 based on a magnetic force variation pattern that will be described with reference to FIG. 6.

The magnetic sensor 440 may sense magnetic field. For example, the magnetic sensor 440 may be disposed in an internal space 470 defined by to be within the circumstance of the rotating body 410. And more particularly, the magnetic sensor 440 may be disposed in a space 471 of the internal space, and may be between the pair of Hall sensor 431 and 432 and the rotation axis 490. At the same time, the magnetic sensor 440 may be disposed in an area 472 that is outside the area in which an inner magnet 460 is disposed in the space 471 defined by to be between the pair of Hall sensors 431 and 432 and the rotation axis 490. As shown in FIGS. 4A through 4C, the inner magnet 460 may be disposed in a central area (e.g. the space enclosed by the circumference of the rotating body 410), which includes the rotation axis 490. For example, the inner magnet 460 may be disposed in the central area corresponding to the rotation axis 490 between a rear plate (e.g., the rear plate 393 of FIG. 3) and a PCB (e.g., the PCB 380 of FIG. 3), however, the instant disclosure is not so limited. Since the magnet sensor 440 is disposed in the area 472 outside the area in which the inner magnet 460 is disposed, the influence of the inner magnet 460 on the magnetic sensor 440 may be reduced. The processor of the electronic device may generate second magnetic field data that indicates a magnetic field intensity value sensed by the magnetic sensor 440, when magnetic field is sensed by the magnetic sensor 440. The second magnetic field data may include a magnetic field component (e.g., external magnetic field component) cause by an external factor (e.g., geomagnetism). The second magnetic field data may include a value obtained by mixing the above-described internal magnetic field component and the external magnetic field component, and in the second magnetic field data, the magnetic field component by the magnets disposed in the electronic device may be suppressed due to the above-described geometric arrangement, and thus the magnetic field component by the external factor may be further emphasized.

The second magnetic field data may include magnetic field intensity values for different axes. For example, the second magnetic field data may include geomagnetism values that indicate geomagnetism intensity sensed in three axes (e.g., the x-axis, the y-axis and the z-axis). The processor may generate the second magnetic field data by performing a calibration to eliminate influence by the magnets 420 (e.g., the plurality of magnets 420 and the inner magnet 460) included in the electronic device from raw data generated through sensing by the magnetic sensor 440, which will be described below. The magnetic sensor 440 may be disposed in a PCB.

For example, distances from the magnetic sensor 440 to the pair of Hall sensors 431 and 432 may be the same. When viewed in a direction perpendicular to the plane corresponding to the rotating body 410, the virtual straight line 484 from the magnetic sensor 440 toward the rotation axis 490 may bisect the angle between the virtual straight lines 483 from the pair of Hall sensors 431 and 432 toward the rotation axis 490. However, the position of the magnetic sensor 440 is not limited thereto.

The magnetic sensor 440 may be disposed to be spaced apart from a plane 419 on which the plurality of magnets 420 are disposed in the rotating body 410. As shown in FIG. 4C, the magnetic sensor 440 may be disposed below the plane 419 on which the plurality of magnets 420 are disposed in the bezel part 450.

The pair of Hall sensors 431 and 432 and the magnetic sensor 440 may be sensors configured to measure magnetic field. The measurement resolution of the pair of Hall sensors 431 and 432 may be lower than the measurement resolution of the magnetic sensor 440. Higher measurement resolution may correspond to more precise measurement ability. The range of measurable magnetic force of the pair of Hall sensors 431 and 432 may be greater than the range of measurable magnetic force of the magnetic sensor 440. That is, the pair of Hall sensors 431 and 432 may coarsely sense a wide range with low resolution, and the magnetic sensor 440 may precisely sense a narrow range with high resolution.

The processor (e.g., the processor 120 of FIG. 1) may be electrically connected to the pair of Hall sensors 431 and 432 and the magnetic sensor 440. The processor may calibrate the second magnetic field data generated through sensing by the magnetic sensor 440, based on the first magnetic field data. Operations of the processor will be described in detail with reference to FIGS. 5 through 11. A memory (e.g., the memory 130 of FIG. 1) may be electrically connected to the above-described processor. The processor and the memory may be disposed on a PCB that is coupled to and/or connected to the bezel part 450 (e.g., the side bezel structure 310 of FIG. 3).

Figure 5:
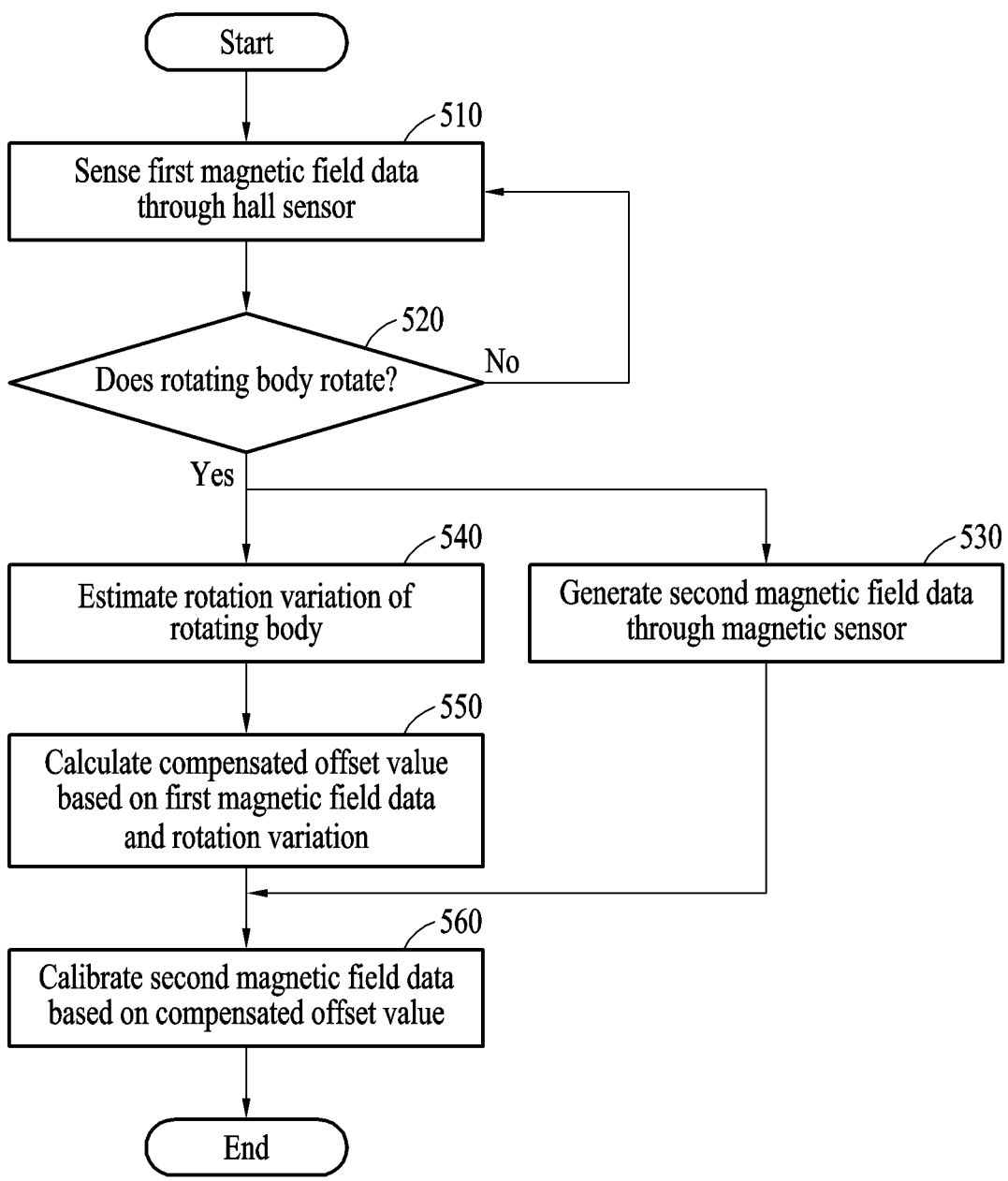
FIG. 5 is a flowchart illustrating a method of calibrating magnetic field data according to an example embodiment.

FIG. 5 is a flowchart illustrating a method of calibrating magnetic field data according to an example embodiment.

In operation 510, an electronic device (e.g., the electronic device 101 of FIG. 1, the electronic device 200 of FIG. 2, or the electronic device 300 of FIG. 3) may generate first magnetic field data through sensing by Hall sensors. For example, the electronic device may generate the first magnetic field data caused by a plurality of magnets (e.g., the magnets 420 of FIGS. 4A through 4C) included in a rotating body (e.g., the rotating body 410 of FIGS. 4A through 4C) coupled to a bezel part of the electronic device to be rotatable about a rotation axis, where the magnetic field is sensed through a pair of Hall sensors (e.g., the pair of Hall sensors 431 and 432 of FIGS. 4A through 4C) disposed in the bezel part.

In operation 520, the electronic device may determine whether the rotating body has rotated. According to an example embodiment, the electronic device may perform a calibration operation, which will be described below, every time the rotating body rotates. For example, the electronic device may determine whether the rotating body has rotated, based on the position of the rotating body at a point in time (e.g., previous calibration time point) at which a previous calibration operation is performed. The electronic device may detect a change of the internal magnetic field caused by the rotation of the rotating body while monitoring the first magnetic field data according to operation 510. The electronic device may determine that the rotating body has rotated in response to the first magnetic field data being changed via sensing by the pair of Hall sensors. The electronic device may refrain from calibration of the sensing data of the magnetic sensor (e.g., the magnetic sensor 440 of FIGS. 4A through 4C), until a rotation of the rotating body is detected. The electronic device may initiate calibration for second magnetic field data of the magnetic sensor, in response to a rotation of the rotating body being detected.

In operation 530, the electronic device may generate the second magnetic field data through sensing by the magnetic sensor. For example, the electronic device may generate the second magnetic field data using data sensed by the magnetic sensor disposed in an internal space defined by the circumference of the rotating body. The processor of the electronic device may generate the second magnetic field data by applying a calibration coefficient that will be described with reference to FIG. 7 to raw data generated through the magnetic sensor.

In operation 540, the electronic device may estimate a rotation variation of the rotating body. The electronic device may estimate a rotation angular displacement that varies from a previous angular position at a previous calibration time point to a target angular position at a target time point (e.g., current time point) as the rotation variation, based on a magnetic variation pattern in the first magnetic field data caused by the rotation of the rotating body. The processor of the electronic device may generate magnetic field difference data that represents the difference between first magnetic field data collected from the pair of Hall sensors, and may estimate the rotation variation based on the magnetic field difference data and the magnetic variation pattern. The estimation of the rotation variation will be described with reference to FIG. 6.

In operation 550, the electronic device may calculate a compensated offset value based on the rotation variation of the rotating body and the first magnetic field data. The magnetic field offset value may be an offset value for eliminating a component that is not the geomagnetism component from the second magnetic field data. The compensated offset value may be an offset value generated by compensating for a magnetic field offset value, and may be more accurate than the magnetic field offset value alone. A calculation of the offset value will be described with reference to FIGS. 8 and 9.

In operation 560, the electronic device may calibrate the second magnetic field data based on the compensated offset value. For example, the electronic device may calculate calibrated second magnetic field data by applying (e.g., adding or subtracting) the compensated offset value to the second magnetic field data. The electronic device may determine an azimuth (e.g., magnetic azimuth) based on the calibrated second magnetic field data. For example, the electronic device may output the determined azimuth to a display (e.g., the display module 160 of FIG. 1).

Figure 6:
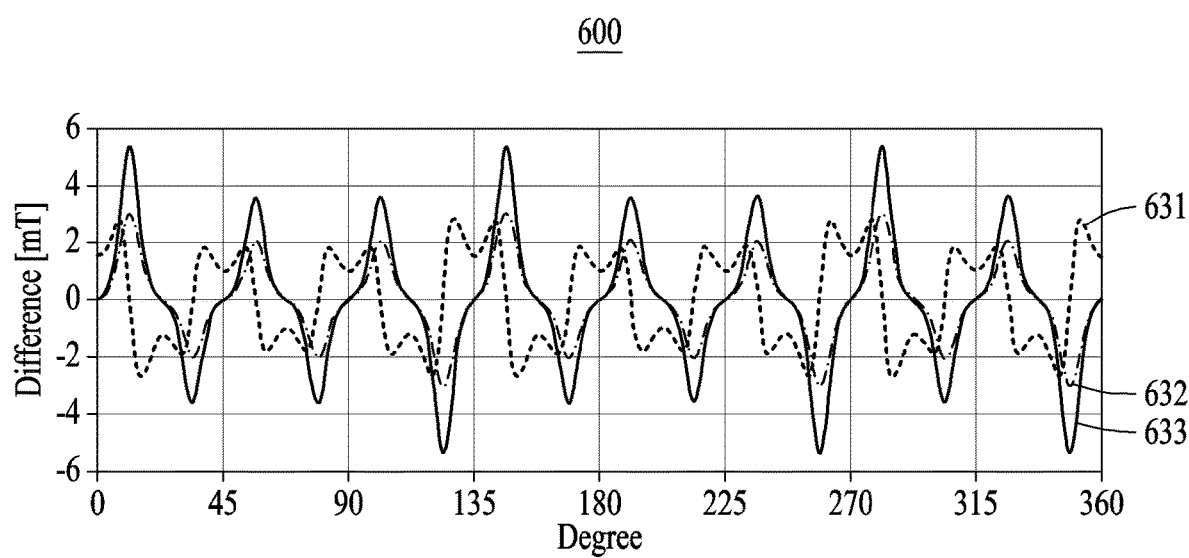
FIG. 6 illustrates an example of first magnetic field data collected by a pair of Hall sensors according to an example embodiment.

FIG. 6 illustrates an example of first magnetic field data collected by a pair of Hall sensors according to an example embodiment.

According to an example embodiment, an electronic device (e.g., the electronic device 300 of FIG. 3) may estimate a rotation variation of a rotating body as described above with reference to operation 540 of FIG. 5. For example, the electronic device may determine a rotation variation of a rotating body (e.g., the rotating body 410 of FIGS. 4A through 4C) based on a magnetic force difference pattern 600 collected from a pair of Hall sensors (e.g., the pair of Hall sensors 431 and 432 of FIGS. 4A through 4C).

The magnetic force difference pattern 600 of FIG. 6 may be represented by curves showing differences in value between first magnetic field data generated through sensing by the pair of Hall sensors (e.g., a first Hall sensor and a second Hall sensor), while the rotating body is completed rotated (e.g., from 0 degrees to 360 degrees). The differences in value between the first magnetic field data may be the differences between first magnetic field data generated through sensing by the first Hall sensor and first magnetic field data generated through sensing by the second Hall sensor, and may be referred to as "magnetic field difference data." In FIG. 6, the vertical axis of the magnetic force difference pattern 600 may represent the differences in value and may be expressed by milli Tesla (mT), and the horizontal axis of the magnetic force difference pattern 600 may represent the angle at which the rotating body rotates from a reference angular position (e.g., the angular position set to 0 degrees) and may be expressed by degrees. The magnetic force difference pattern 600 may include curves 631, 632 and 633 corresponding to magnetic field difference values sensed for each axis (e.g., the x-axis, the y-axis and the z-axis).

The entire rotation range of the rotating body (e.g. 360 degrees) may be divided according to a number of the plurality of magnets (e.g., the magnets 420 of FIGS. 4A through 4C). A rotation interval may represent the angular interval obtained by dividing the whole rotation range by the number of magnets. As described above with reference to FIGS. 4A through 4C, since the magnets of the plurality of magnets are spaced equally apart on the circumference of the rotating body, the rotation intervals may be equal to each other, and may be obtained by dividing the whole rotation range by the number of the plurality of magnets. In example of the present disclosure, since eight magnets are disposed in the rotating body, the whole rotation range may be divided into eight rotation intervals. For example, the whole rotation range may be divided into a first rotation interval through an eighth rotation interval. The first rotation interval may be an angular interval from 0 degrees to 45 degrees about a reference angular position, a second rotation interval may be an angular interval from 45 degrees to 90 degrees, a third rotation interval may be an angular interval from 90 degrees to 135 degrees, a fourth rotation interval may be an angular interval from 135 degrees to 180 degrees, a fifth rotation interval may be an angular interval from 180 degrees to 225 degrees, a sixth rotation interval may be an angular interval from 225 degrees to 270 degrees, a seventh rotation interval may be an angular interval from 270 degrees to 315 degrees, and the eighth rotation interval may be an angular interval from 315 degrees to 360 degrees. An angle range corresponding to one rotation interval may be an angle formed between the rotating body and two adjacent magnets.

As described above, since the relative position between the pair of Hall sensors with respect to the plurality of magnets varies as the rotating body rotates, magnetic field intensity values acquired from each of the pair of Hall sensors may vary. As such, the difference between the magnetic field intensity values may vary according to the rotation of the rotating body. Difference data indicating the differences between the magnetic field intensity values may include the same or similar pattern repeated every time the rotating body rotates by an angle range (e.g., 45 degrees) corresponding to one rotation interval. For example, since eight magnets are provided and the angle between two adjacent magnets is 45 degrees as shown in FIGS. 4A through 4C and FIG. 6, the change in the magnetic field difference value in each axis (e.g., the x-axis, the y-axis and the z-axis) may be repeated every time the rotating rotates by 45 degrees. That is, peaks of the curve 631 of the magnetic field difference value for the first axis, peaks of the curve 632 of the magnetic field difference value for the second axis, and peaks of the curve 633 of the magnetic field difference value for the third axis in one rotation interval may be at angular positions that are identical or similar to the angular positions in which the peaks are represented in another rotation interval. The angular position of a peak is described as an example of a pattern for each rotation interval of the magnetic field difference data; however, the pattern is not limited thereto.

According to an example embodiment, the electronic device may determine an angular displacement by comparing current data to a previous calibration time point using the magnetic force difference pattern 600. FIG. 6 illustrates the magnetic force difference pattern 600 for the whole rotation range, however, the instant disclosure is not so limited. For example, the electronic device may determine the angular displacement compared to the previous calibration time point based on the magnetic force difference pattern 600 for a portion of the rotation intervals (e.g., one rotation interval from 0 degrees to 45 degrees). According to an embodiment, the electronic device may estimate a rotation variation (e.g., rotation angular displacement) of the rotating body from the previous calibration time point to a target time point, based on an angular position (e.g., previous angular position) recorded at the previous calibration time point, the magnetic force difference pattern 600, and magnetic field difference data generated at the target time point. The electronic device may convert the magnetic field difference data into the rotation angular displacement in which the rotating body rotates compared to the previous calibration time point, based on the magnetic force difference pattern 600.

The electronic device may determine a final angular position based on the previous angular position and the converted rotation angular displacement. For example, the electronic device may accumulate the rotation angular displacement, which is converted based on the magnetic force difference pattern 600 from the magnetic field difference data detected after the previous calibration time point, in the previous angular position. The electronic device may determine a final angular position by adding the rotation angular displacement accumulated in the previous angular position. Also, the electronic device may accumulate an angular change to an angle range corresponding to one rotation interval. If a sum of the angular position at the previous calibration time point and the accumulated angular displacement from the previous calibration time point to the target time point exceeds an angle range of a corresponding rotation interval, the electronic device may initialize accumulation of the angular displacement. The electronic device may re-accumulate the angular displacement based on the angle range of an adjacent rotation interval, and add (or subtract) the accumulated angular displacement. For example, if the rotating body rotates from 30 degrees at the previous calibration time point to 60 degrees at the target calibration time point, the electronic device may accumulate and calculate the rotation variation from 30 degrees to 45 degrees involved in the first rotation interval, and from a time point at which the rotating body rotates 45 degrees, the electronic device may reset and ignore a previously accumulated rotation variation. From the point in time at which the rotating body rotates 45 degrees to be in the second rotation interval, the electronic device may calculate 60 degrees that is a final angular position by adding the rotation displacement from 45 degrees to 60 degrees to 45 degrees that is a boundary value of the second rotation interval. Since the magnetic force difference pattern 600 represented in each rotation interval is the same as or similar to the magnetic force difference pattern 600 represented in another rotation interval, the electronic device may reset the rotation displacement accumulation for each rotation interval, as described above.

For reference, the magnetic force difference pattern 600 of FIG. 6 may be a pattern in a case where there is a deviation between magnetic forces of a plurality of magnets, and peak values may be slightly different due to magnetic force deviation of individual magnets in a pattern repeated in every 45 degrees. If the magnetic force deviation of the individual magnets is assumed to be "0", patterns having completely the same shape and magnitude may be repeated in every 45 degrees.

Figure 7:
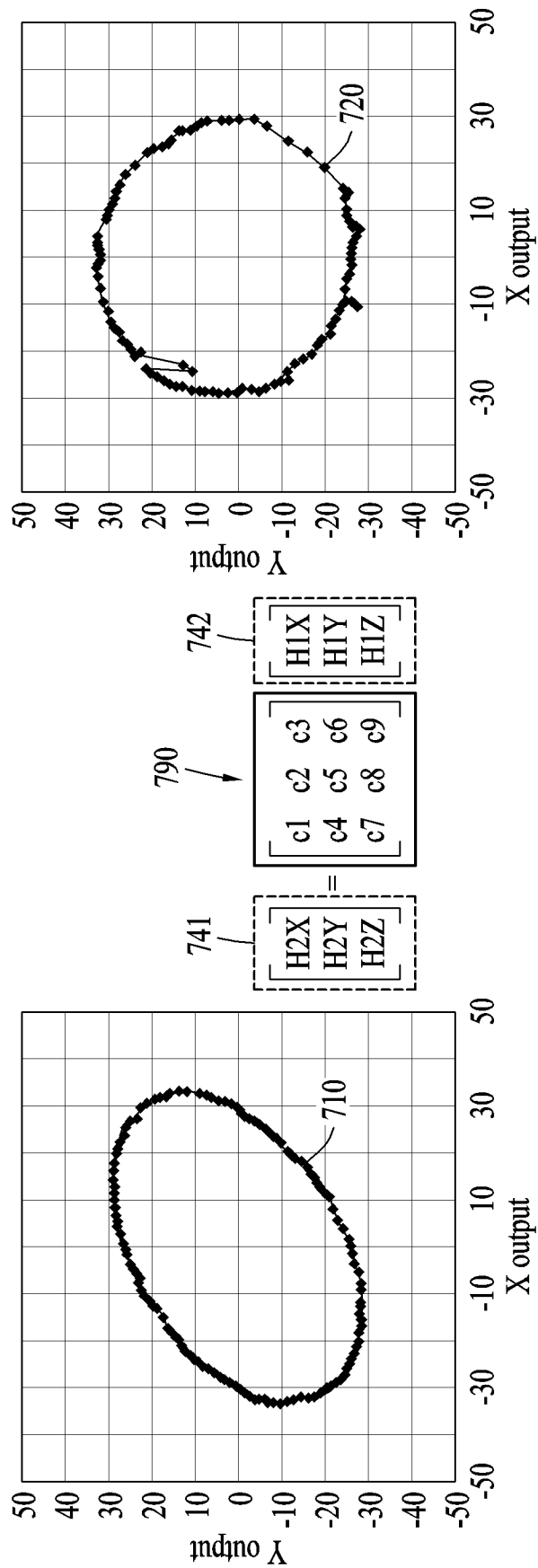
FIG. 7 illustrates an acquisition of second magnetic field data collected by a magnetic sensor according to an example embodiment.

FIG. 7 illustrates an acquisition of second magnetic field data collected by a magnetic sensor according to an example embodiment.

According to an example embodiment, a magnetic sensor (e.g., the magnetic sensor 440 of FIGS. 4A through 4C) of an electronic device (e.g., the electronic device 300 of FIG. 3) may measure an external magnetic force. The magnetic sensor may measure, for example, geomagnetism with respect to three axes (e.g., the x-axis, the y-axis and the z-axis), and output a geomagnetism value corresponding to each of the three axes, and the electronic device may determine the magnetic north direction based on geomagnetism values measured by the magnetic sensor. Along a circular trajectory about one geographical position, the trajectory of an azimuth (e.g., magnetic azimuth) may be calculated from magnetic values sensed while the electronic device is rotating in one direction.

Distortion may occur in the magnetic field sensed by the magnetic sensor due to the inner arrangement structure (e.g., central magnet and positions of magnets of a rotating body) of the electronic device. Due to the distortion included in a geomagnetism value sensed and output by the magnetic sensor, errors may occur when the azimuth (e.g., the magnetic azimuth) is calculated. In FIG. 7, an azimuth trajectory 710 having the above-described error calculated based on raw data 742 of the magnetic sensor may be represented in an oval form. The raw data 742 may be magnetic values for three axes generated through the magnetic sensor, and may include data that is not calibrated.

A processor (e.g., the processor 120) of the electronic device according to an example embodiment may acquire second magnetic field data 741 by applying a calibration coefficient for the raw data 742 generated through the magnetic sensor. As illustrated in FIG. 7, the calibration coefficient may be expressed as a 3×3 vector 790. The electronic device may acquire the second magnetic field data 741 by multiplying the calibration coefficient and the raw data 742. An azimuth trajectory 720 calculated based on the second magnetic field data 741 may be represented in a circular form, as shown in FIG. 7. The circular azimuth trajectory 720 may represent a reduction of distortion in the second magnetic field data 741, and the electronic device may calculate an azimuth with reduced error based on the second magnetic field data 741.

Figure 8:
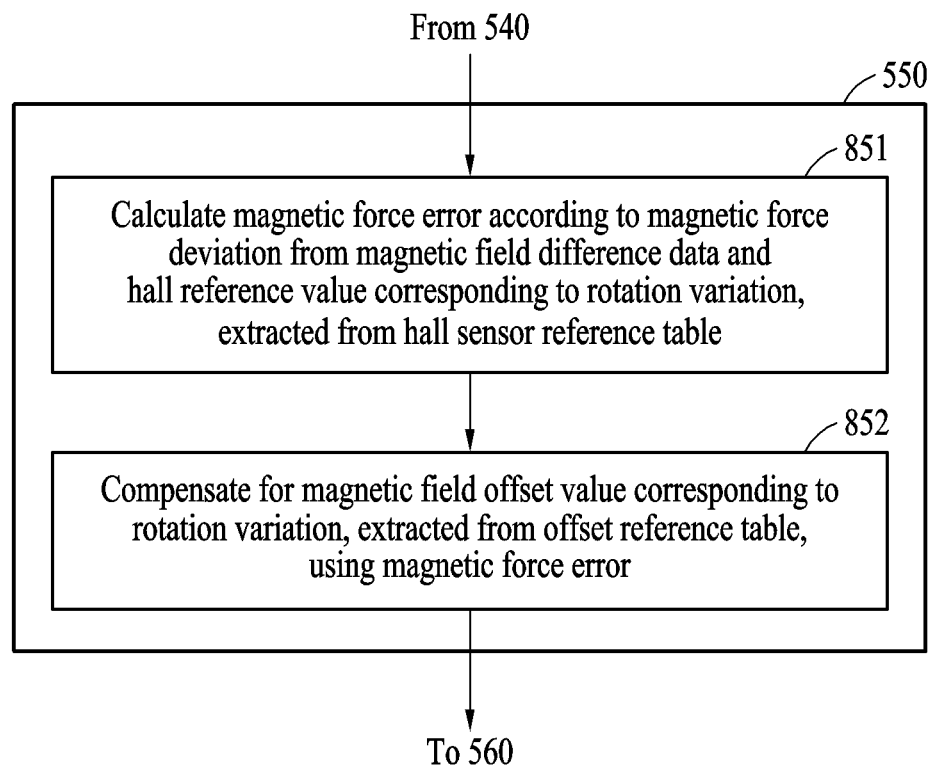
FIG. 8 is a flowchart illustrating an operation of compensating for an offset for calibrating second magnetic field data according to an example embodiment.

FIG. 8 is a flowchart illustrating an operation of compensating for an offset for calibrating second magnetic field data according to an example embodiment.

In operation 550 described above, an electronic device (e.g., the electronic device 300 of FIG. 3) may determine an offset corresponding to an angular position of a target time point by using reference tables. The angular position of the target time point may be the position in which an angular displacement that is accumulated corresponding to a rotation variation of a rotating body from an angular position at a previous time point is added (or subtracted), as described above with reference to FIG. 6. The reference tables may be prepared for one angle range due to the characteristics of the magnetic force difference pattern being repeated for each angle range of the rotation intervals, as described above. A reference table may be pre-generated through a simulation of assuming a typical value 910 of a plurality of magnets disposed in the rotating body. The reference table may be provided regardless of errors caused by magnetic force deviation of the disposed magnets. The above-described error may be compensated for through an operation that will be described below.

For example, in operation 851, the electronic device may calculate a magnetic error according to a magnetic force deviation 900 from magnetic field difference data and a Hall reference value corresponding to an angular position (or a rotation variation) extracted from a Hall sensor reference table. The electronic device may extract a Hall reference value corresponding to the angular position of the rotating body from the Hall reference table. The Hall sensor reference table may include values, generated through Hall sensors, of the magnetic force generated by magnets having the magnetic force deviation 900 of 0% at the angular position determined with respect to the target time point, and may be generated as shown in Table 1 below. However, the data format of the Hall sensor reference table is not limited to Table 1.

TABLE 1

| Angle | Hall sensor reference table | | (unit: μT) |
|---|---|---|---|
| (degree) | x | y | z |
| 0 | $refX_{h,0}$ | $refY_{h,0}$ | $refZ_{h,0}$ |
| 1 | $refX_{h,1}$ | $refY_{h,1}$ | $refZ_{h,1}$ |

TABLE 1-continued

| Angle | Hall sensor reference table | | (unit: μT) |
| --- | --- | --- | --- |
| (degree) | x | y | z |
| 2 | $refX_{h,2}$ | $refY_{h,2}$ | $refZ_{h,2}$ |
| 3 | $refX_{h,3}$ | $refY_{h,3}$ | $refZ_{h,3}$ |
| ... | | | |
| θ | $refX_{h,\theta}$ | $refY_{h,\theta}$ | $refZ_{h,\theta}$ |
| ... | | | |
| 42 | $refX_{h,42}$ | $refY_{h,42}$ | $refZ_{h,42}$ |
| 43 | $refX_{h,43}$ | $refY_{h,43}$ | $refZ_{h,43}$ |
| 44 | $refX_{h,44}$ | $refY_{h,44}$ | $refZ_{h,44}$ |
| 45 | $refX_{h,45}$ | $refY_{h,45}$ | $refZ_{h,45}$ |

Table 1 shows a Hall reference value $refX_{h,\theta}$ for an x-axis, a Hall reference value $refY_{h,\theta}$ for a y-axis, and a Hall reference value $refZ_{h,\theta}$ for a z-axis, as Hall reference values corresponding to an arbitrary angular position θ within an angle range corresponding to one rotation interval. The angular position θ may include, for example, an angle of 0 degrees through 45 degrees, but an angle is not limited to an integer and may be a real number depending on how the reference table is implemented. In Table 1, the unit of a magnetic force difference value in the Hall sensor reference table may be μT. Further, in another example, the unit of the angle may be replaced with radians.

The electronic device may generate magnetic field difference data based on the first magnetic field data generated in operation 510, as given in Equation 1 below. As described above, the magnetic field difference data may be the difference between first magnetic field data generated through a first Hall sensor and a second Hall sensor.

(hall_DiffX,hall_DiffY,hall_DiffZ)=(hall_X1,hall_Y1,hall_Z1)−(hall_X2,hall_Y2,hall_Z2)  [Equation 1]

In Equation 1, hall_X1, hall_Y1 and hall_Z1 denote magnetic values for the x-axis, the y-axis and the z-axis generated through the first Hall sensor, and hall_X2, hall_Y2 and hall_Z2 denote magnetic values for the x-axis, the y-axis and the z-axis generated through the second Hall sensor.

The electronic device may calculate the magnetic force error according to the magnetic force deviation 900 of the magnets disposed in the rotating body from the extracted Hall reference value and the magnetic field difference data. For example, the electronic device may apply the above-described magnetic field difference data to the extracted Hall reference value, as given in Equation 2 below.

(ErrX,ErrY,ErrZ)=($refX_{h,\theta}$,$refY_{h,\theta}$,$refZ_{h,\theta}$)−(hall_DiffX,hall_DiffY,hall_DiffZ)  [Equation 2]

Figure 9:
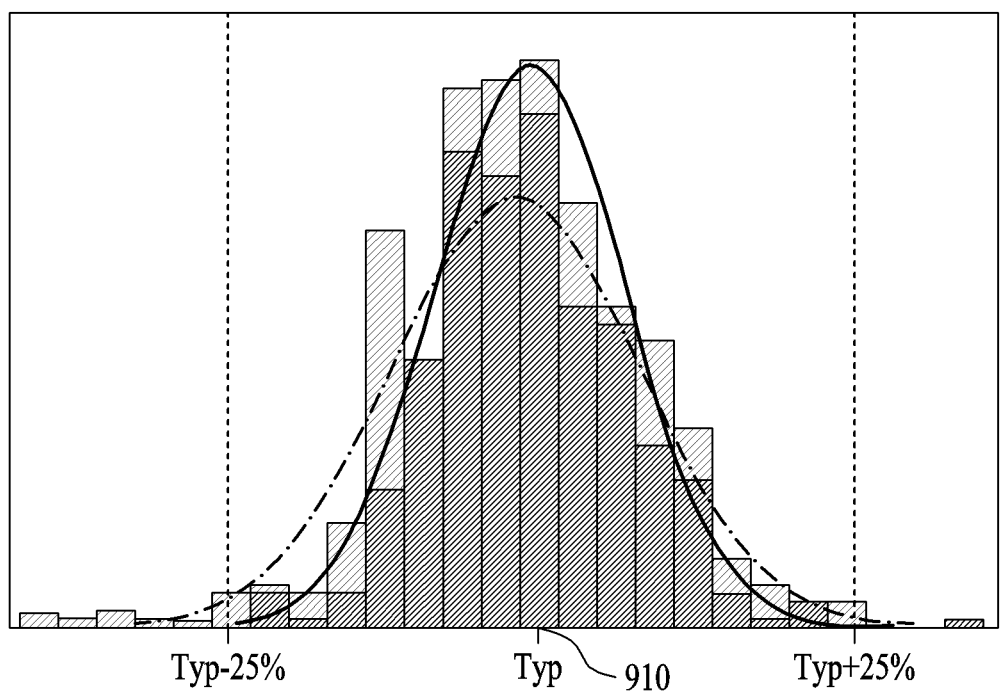
FIG. 9 illustrates a magnetic force deviation of a plurality of magnets according to an example embodiment.

In Equation 2, ErrX, ErrY and ErrZ denote magnetic force errors according to the magnetic force deviation 900 in the x-axis, the y-axis and the z-axis, respectively. FIG. 9 illustrates the magnetic force deviation 900 of the plurality of magnets according to an example embodiment. As shown in FIG. 9, a distribution of the magnetic force according to fabrication errors in mass-production of the magnets may be in a normal distribution within a range of ±25%. The electronic device (e.g., the electronic device 300 of FIG. 3) may calculate the magnetic force error based on the Hall reference value and the magnetic field difference data using Equation 2, to determine the error due to the above deviation. That is, if magnetic force sensed through Hall sensors is caused by a magnet having the magnetic deviation 900 of "0", the error according to Equation 2 may be "0".

As illustrated in FIGS. 4A through 4C, since the magnetic sensor is disposed between the pair of Hall sensors, the magnetic force deviation 900 sensed through the Hall sensors may be utilized in determining the offset of the magnetic sensor. Here, as the difference between distances from the magnetic sensor to the Hall sensors decreases, that is, as the distance between the magnetic sensor and a midpoint between the Hall sensors decreases, the accuracy of the offset may increase.

In operation 852, the electronic device may compensate for a magnetic field offset value corresponding to an angular position (or rotation variation) extracted from an offset reference table, using the magnetic force error. For example, the electronic device may extract a magnetic field offset value corresponding to the angular position of the rotating body from the offset reference table.

The offset reference table may include offset values for compensating for components other than the geomagnetism component, for example, the offset values may compensate for geomagnetism distortion caused by magnets disposed in the electronic device, in the situation in which magnetic force of magnets having the magnetic deviation 900 of 0% or more has an influence on the Hall sensors and the magnetic sensor. Table 2 shows an example of the offset reference table below. Offset values of Table 2 do not necessarily correspond to magnetic force error caused by the magnetic force deviation 900.

TABLE 2

| Angle | Offset reference table | | (unit: μT) |
| --- | --- | --- | --- |
| (degree) | x | y | z |
| 0 | $refX_{m,0}$ | $refY_{m,0}$ | $refZ_{m,0}$ |
| 1 | $refX_{m,1}$ | $refY_{m,1}$ | $refZ_{m,1}$ |
| 2 | $refX_{m,2}$ | $refY_{m,2}$ | $refZ_{m,2}$ |
| 3 | $refX_{m,3}$ | $refY_{m,3}$ | $refZ_{m,3}$ |
| ... | | | |
| θ | $refX_{m,\theta}$ | $refY_{m,\theta}$ | $refZ_{m,\theta}$ |
| ... | | | |
| 42 | $refX_{m,42}$ | $refY_{m,42}$ | $refZ_{m,42}$ |
| 43 | $refX_{m,43}$ | $refY_{m,43}$ | $refZ_{m,43}$ |
| 44 | $refX_{m,44}$ | $refY_{m,44}$ | $refZ_{m,44}$ |
| 45 | $refX_{m,45}$ | $refY_{m,45}$ | $refZ_{m,45}$ |

Table 2 shows a magnetic field offset value $refX_{m,\theta}$ for an x-axis, a magnetic field offset value $refY_{m,\theta}$ for a y-axis, and a magnetic field offset value $refZ_{m,\theta}$ for a z-axis, as magnetic field offset values corresponding to an arbitrary angular position θ within an angle range corresponding to one rotation interval.

The electronic device may compensate for the magnetic field offset values using the magnetic force error, to acquire a more accurate offset value that reflects the distortion by the magnetic force deviation 900. The electronic device may calculate the compensated offset value by compensating for the extracted magnetic field offset value using the magnetic force error calculated based on the magnetic field difference data, as given in Equation 3 below.

(cal_refX,cal_refY,cal_refZ)=($refX_{m,\theta}$,$refY_{m,\theta}$,$refZ_{m,\theta}$)−(ErrX,ErrY,ErrZ)  [Equation 3]

In Equation 3, cal_refX, cal_refY and cal_refZ denote compensated offset values for the x-axis, the y-axis and the z-axis, respectively. Thus, the electronic device may calculate a more accurate offset by compensating for errors caused by the magnetic force deviation 900 at a corresponding angular position, based on the magnetic force difference data generated through the pair of Hall sensors.

Figure 10:
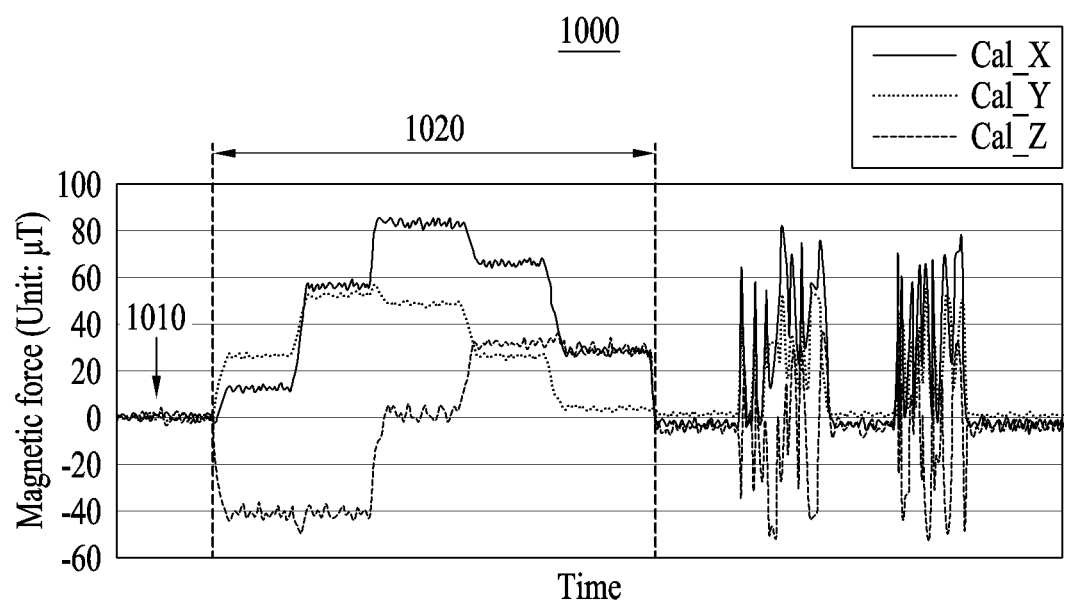
FIG. 10 illustrates a magnetic force variation caused by a movement of a magnet due to a rotation of a rotating body in an electronic device according to an example embodiment.

FIG. 10 illustrates an operation of calibrating information (e.g., second magnetic field data) of a magnetic sensor based on the offset value compensated for in operation 852.

FIG. 10 illustrates a magnetic variation caused by a movement of a magnet due to a rotation of a rotating body in an electronic device according to an example embodiment.

The electronic device according to an example embodiment may calibrate second magnetic field data generated through the magnetic sensor based on the compensated offset value. For example, the electronic device may apply (e.g., add or subtract) a compensated offset value corresponding to each of three axes to an external magnetic field intensity value (e.g., a geomagnetism value) corresponding to each axis, as given in Equation 4 below.

(cal_extX,cal_extY,cal_extZ)=(extX,extY,extZ)−(cal_refX,cal_refY,cal_refZ)     [Equation 4]

In Equation 4, extX, extY and extZ denote a magnetic field intensity value according to the x-axis of the second magnetic field data, a magnetic field intensity value according to the y-axis of the second magnetic field data, and a magnetic field intensity value according to the z-axis of the second magnetic field data, respectively. cal_extX, cal_extY and cal_extZ denote a magnetic field intensity value according to the x-axis of the calibrated second magnetic field data, a magnetic field intensity value according to the y-axis of the calibrated second magnetic field data, and a magnetic field intensity value according to the z-axis of the calibrated second magnetic field data, respectively. Since compensated offset values cal_refX, cal_refY and cal_refZ are offset values that reflect magnetic force deviation of the magnets as well as the arrangement of the disposed magnets, the second magnetic field data may be more accurately calibrated. That is, through a calibration based on the compensated offset value, the difference between an ideal geomagnetism value that needs to be sensed in each axis of the magnetic sensor and an actually measured geomagnetism value may be reduced.

For example, if the angular position of a rotating body varies from a previous calibration time point 1010 over time, distortion may occur on the magnetic force sensed through the magnetic sensor during a time period 1020 in which one or more magnets disposed in the rotating body is moved. FIG. 10 illustrates the difference 1000 between ideal values that need to be sensed in each axis of the magnetic sensor at each time point and the actual values, when the magnet is moved according to the rotation of the rotating body. When the above distorted magnetic field occurs when calculating the azimuth, an azimuth error with 1 degree per about 1 µT may occur. The electronic device may eliminate the difference 1000 of FIG. 10 by calibrating the compensated offset value calculated as described above with reference to FIGS. 1 through 9 in the second magnetic field data.

Figure 11:
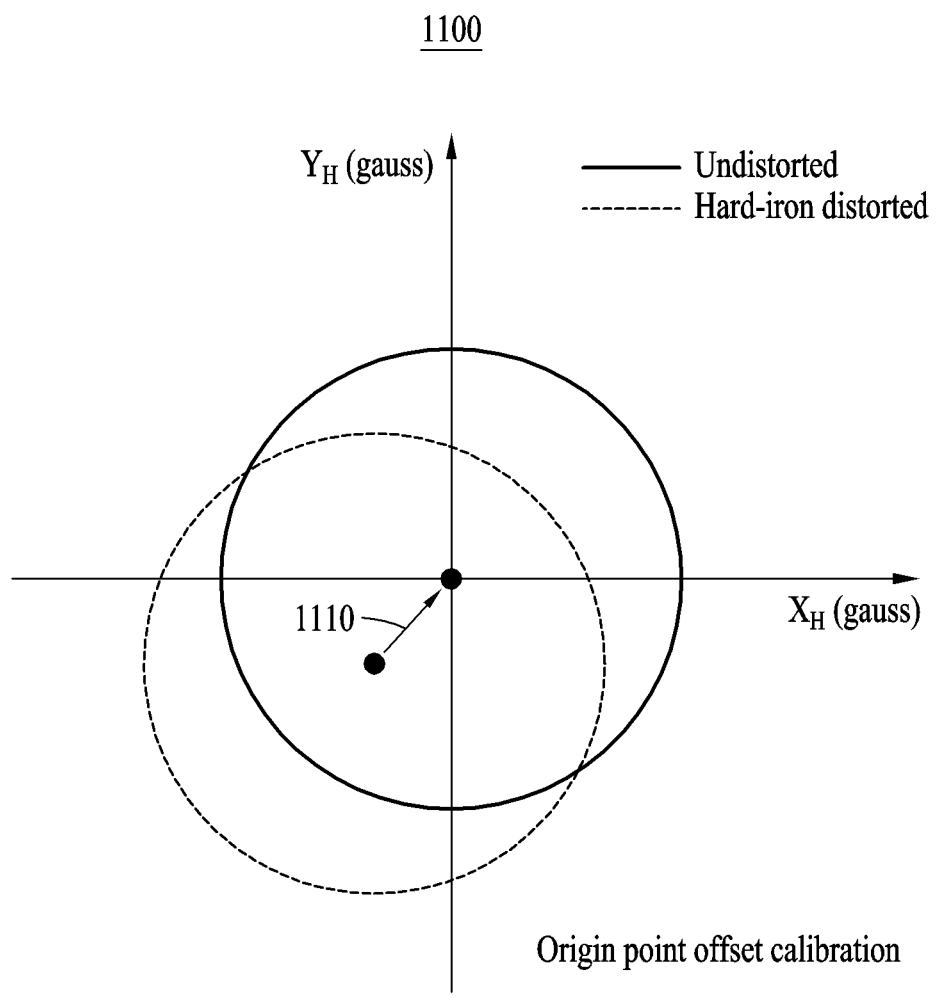
FIG. 11 illustrates an operation in which an electronic device calibrates second magnetic field data according to an example embodiment.

FIG. 11 illustrates an operation in which an electronic device calibrates second magnetic field data according to an example embodiment.

FIG. 11 illustrates a trajectory of an azimuth (e.g., magnetic azimuth) calculated from magnetism values generated through a magnetic sensor while the electronic device (e.g., the electronic device 300 of FIG. 3) is rotating in one direction along a circular trajectory at an arbitrary geographical position. The electronic device may allow a central point of the trajectory of the magnetic azimuth to be located on an origin point through operation 1100 of calibrating the compensated offset value in the second magnetic field data as described above with reference to FIG. 10.

The electronic device may determine an accurate azimuth based on the calibrated second magnetic field data, and output the determined azimuth. For example, the electronic device may determine the direction and intensity of geomagnetism applied to the electronic device, from calibrated geomagnetism values in each axis of the calibrated second magnetic field data. The electronic device may determine an azimuth (e.g., magnetic azimuth) at which a reference axis of the electronic device is directed from determined geomagnetism values.

Certain of the above-described embodiments of the present disclosure can be implemented in hardware, firmware or via the execution of software or computer code that can be stored in a recording medium such as a CD ROM, a Digital Versatile Disc (DVD), a magnetic tape, a RAM, a floppy disk, a hard disk, or a magneto-optical disk or computer code downloaded over a network originally stored on a remote recording medium or a non-transitory machine readable medium and to be stored on a local recording medium, so that the methods described herein can be rendered via such software that is stored on the recording medium using a general purpose computer, or a special processor or in programmable or dedicated hardware, such as an ASIC or FPGA. As would be understood in the art, the computer, the processor, microprocessor controller or the programmable hardware include memory components, e.g., RAM, ROM, Flash, etc. that may store or receive software or computer code that when accessed and executed by the computer, processor or hardware implement the processing methods described herein.

While the present disclosure has been shown and described with reference to various embodiments thereof, it will be understood by those skilled in the art that various changes in form and details may be made therein without departing from the present disclosure as defined by the appended claims and their equivalents.

What is claimed is:

1. An electronic device, comprising:
a rotating body coupled to a bezel part of the electronic device to be rotatable about a rotation axis, the rotating body comprising a plurality of magnets;
a pair of Hall sensors disposed in the bezel part and configured to sense a magnetic field generated by the plurality of magnets;
a magnetic sensor disposed in an internal space within a circumference of the rotating body;
at least one processor comprising processing circuitry, electrically connected to the pair of Hall sensors and the magnetic sensor; and
memory comprising one or more storage medium storing instructions that, when executed by the at least one processor, individually and/or collectively, cause the electronic device to:
calibrate, using first magnetic field data generated based on the pair of Hall sensors, second magnetic field data generated based on the magnetic sensor.

2. The electronic device of claim 1, wherein an angle formed between the pair of Hall sensors about the rotation axis is less than an angle formed between two adjacent magnets in the plurality of magnets about the rotation axis.

3. The electronic device of claim 1, wherein when viewed in a direction perpendicular to a plane corresponding to the rotating body, an angle between virtual straight lines from points corresponding to the pair of Hall sensors on the plane toward the rotation axis is half of an angle between virtual straight lines from two adjacent magnets toward the rotation axis.

4. The electronic device of claim 1, wherein the plurality of magnets are accommodated in the rotating body, and disposed to be spaced apart by a same distance along the circumference of the rotating body.

5. The electronic device of claim 4, wherein:
the plurality of magnets are eight magnets, and
an angle between virtual straight lines from two adjacent magnets in the plurality of magnets toward the rotation axis is 45 degrees.

6. The electronic device of claim 5, wherein an angle between virtual straight lines from the pair of Hall sensors toward the rotation axis is 22.5 degrees.

7. The electronic device of claim 1, wherein the magnetic sensor is disposed between the pair of Hall sensors and the rotation axis when viewed in a direction perpendicular to a plane corresponding to the rotating body.

8. The electronic device of claim 7, wherein the magnetic sensor is disposed in an area outside an area, in which an inner magnet is disposed, in the internal space between the pair of Hall sensors and the rotation axis.

9. The electronic device of claim 7, wherein the magnetic sensor is disposed to be spaced apart from a plane on which the plurality of magnets are disposed in the rotating body.

10. The electronic device of claim 1, wherein the magnetic sensor is equidistant to each of the pair of Hall sensors.

11. The electronic device of claim 1, wherein when viewed in a direction perpendicular to a plane corresponding to the rotating body, a virtual straight line from the magnetic sensor toward the rotation axis bisects an angle between virtual straight lines from the pair of Hall sensors toward the rotation axis.

12. The electronic device of claim 1, wherein the instructions when executed by the at least one processor, individually and/or collectively, cause the electronic device to:
determine a variation of a rotation of the rotating body based on a magnetic force difference pattern collected from the pair of Hall sensors.

13. The electronic device of claim 1, wherein the instructions when executed by the at least one processor, individually and/or collectively, cause the electronic device to:
apply a calibration coefficient to raw data generated based on the magnetic sensor.

14. The electronic device of claim 1, wherein the instructions when executed by the at least one processor, individually and/or collectively, cause the electronic device to:
generate magnetic field difference data representing a difference between the first magnetic field data collected from the pair of Hall sensors.

15. The electronic device of claim 14, wherein the instructions when executed by the at least one processor, individually and/or collectively, cause the electronic device to:
extract a Hall reference value corresponding to an angular position of the rotating body from a Hall sensor reference table; and
calculate a magnetic force error according to a magnetic force deviation of the plurality of magnets disposed in the rotating body, using the extracted Hall reference value and the magnetic field difference data.

16. The electronic device of claim 15, wherein the instructions when executed by the at least one processor, individually and/or collectively, cause the electronic device to:
extract a magnetic field offset value corresponding to the angular position of the rotating body from an offset reference table; and
calculate a compensated offset value by compensating for the extracted magnetic field offset value using the magnetic force error calculated based on the magnetic field difference data.

17. The electronic device of claim 16, wherein the instructions when executed by the at least one processor, individually and/or collectively, cause the electronic device to:
calibrate the second magnetic field data generated based on the magnetic sensor based on the compensated offset value.

18. The electronic device of claim 1, wherein the instructions when executed by the at least one processor, individually and/or collectively, cause the electronic device to:
initiate a calibration for the second magnetic field data of the magnetic sensor, in response to a rotation of the rotating body being detected.

19. The electronic device of claim 1, wherein the internal space is between the pair of Hall sensors and the rotation axis.

20. A method performed by an electronic device, the method comprising:
generating first magnetic field data for a magnetic field caused by a plurality of magnets included in a rotating body coupled to a bezel part of the electronic device to be rotatable about a rotation axis, based on a pair of Hall sensors disposed in the bezel part;
generating second magnetic field data based on a magnetic sensor disposed in an internal space within a circumference of the rotating body;
calculating a compensated offset value based on an angular position of the rotating body and the first magnetic field data; and
calibrating the second magnetic field data based on the compensated offset value.

21. A non-transitory computer-readable storage medium storing instructions that, when executed by a processor, cause the processor to perform the method of claim 20.

* * * * *